(12) United States Patent
Ding et al.

(10) Patent No.: US 11,798,883 B2
(45) Date of Patent: Oct. 24, 2023

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Shaofeng Ding, Suwon-si (KR); Jeong Hoon Ahn, Seongnam-si (KR); Yun Ki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 65 days.

(21) Appl. No.: 17/527,230

(22) Filed: Nov. 16, 2021

(65) Prior Publication Data

US 2022/0328404 A1    Oct. 13, 2022

(30) Foreign Application Priority Data

Apr. 8, 2021   (KR) .................. 10-2021-0045608
Jun. 3, 2021   (KR) .................. 10-2021-0072384

(51) Int. Cl.
*H01L 23/48* (2006.01)
*H01L 23/528* (2006.01)
(Continued)

(52) U.S. Cl.
CPC .... *H01L 23/5283* (2013.01); *H01L 21/76807* (2013.01); *H01L 21/76816* (2013.01);
(Continued)

(58) Field of Classification Search
CPC ....... H01L 23/00; H01L 23/48; H01L 23/481; H01L 23/522; H01L 23/528; H01L 23/538; H01L 23/5226; H01L 23/5283; H01L 23/5385; H01L 23/5386; H01L 25/18; H01L 25/0652; H01L 25/0657; H01L 21/768; H01L 21/76807; H01L 21/76808; H01L 21/76816; H01L 21/76846; H01L 21/76871; H01L 21/76898; H01L 2225/06513; H01L 2225/06517; H01L 2225/06541; H01L 2225/06544;
(Continued)

(56) References Cited

U.S. PATENT DOCUMENTS 8,563,403 B1   10/2013   Farooq et al.
9,041,146 B2   5/2015   Lee et al.
(Continued)

*Primary Examiner* — Chuong A Luu
(74) *Attorney, Agent, or Firm* — Lee IP Law, P.C.

(57) ABSTRACT

A semiconductor device includes an integrated circuit (IC) and an interlayer dielectric layer on the substrate, a contact through the interlayer dielectric layer and electrically connected to the IC, a wiring layer on the interlayer dielectric layer with a wiring line electrically connected to the contact, a first passivation layer on the wiring layer, first and second pads on the first passivation layer, and a through electrode through the substrate, the interlayer dielectric layer, the wiring layer, and the first passivation layer to connect to the first pad. The first pad includes a first head part on the first passivation layer, and a protruding part that extends into the first passivation layer from the first head part, the protruding part surrounding a lateral surface of the through electrode in the first passivation layer, and the second pad is connected to the IC through the wiring line and the contact.

11 Claims, 20 Drawing Sheets

(51) Int. Cl.
 *H01L 25/065* (2023.01)
 *H01L 23/522* (2006.01)
 *H01L 21/768* (2006.01)
 *H01L 23/538* (2006.01)

(52) U.S. Cl.
 CPC .. *H01L 21/76846* (2013.01); *H01L 21/76871* (2013.01); *H01L 21/76898* (2013.01); *H01L 23/481* (2013.01); *H01L 23/5226* (2013.01); *H01L 25/0652* (2013.01); *H01L 25/0657* (2013.01); *H01L 23/5385* (2013.01); *H01L 23/5386* (2013.01); *H01L 2225/06513* (2013.01); *H01L 2225/06517* (2013.01); *H01L 2225/06544* (2013.01)

(58) Field of Classification Search
 CPC . H01L 2224/16145; H01L 2224/16225; H01L 2224/32145; H01L 2224/73204; H01L 2924/181; H01L 2924/15311

USPC ........................................................ 257/690
 See application file for complete search history.

(56) References Cited

U.S. PATENT DOCUMENTS

| | | |
|---|---|---|
| 9,418,933 B2 | 8/2016 | Lin et al. |
| 9,865,649 B2 | 1/2018 | Tan et al. |
| 10,347,712 B1 | 7/2019 | Verma et al. |
| 10,475,990 B2 | 11/2019 | Hsieh et al. |
| 2019/0326199 A1 | 10/2019 | Lin et al. |
| 2021/0066123 A1* | 3/2021 | Hwang .................. H01L 23/481 |
| 2022/0059400 A1* | 2/2022 | Tsai ................... H01L 23/53295 |
| 2022/0093462 A1* | 3/2022 | Shih ...................... H01L 23/481 |

* cited by examiner

United States Patent US 11,798,883 B2

SEMICONDUCTOR DEVICE AND METHOD OF FABRICATING THE SAME

CROSS-REFERENCE TO RELATED APPLICATIONS

This U.S. nonprovisional application claims priority under 35 U.S.C § 119 from, and the benefit of, Korean Patent Application Nos. 10-2021-0045608, filed on Apr. 8, 2021, and 10-2021-0072384, filed on Jun. 3, 2021, in the Korean Intellectual Property Office, the contents of which are herein incorporated by reference in their entirety.

BACKGROUND

1. Field

Embodiments are directed to a semiconductor device and a method of fabricating the same, and more particularly, to a semiconductor device that includes a through electrode and a method of fabricating the same.

2. Description of the Related Art

A gradual reduction in size and design rule of a semiconductor device requires scale-down of transistors. The decrease in size of the transistors may reduce operating characteristics of the semiconductor device. Accordingly, various studies have been conducted to develop methods of fabricating semiconductor devices that have superior performances while overcoming limitations caused by high integration of the semiconductor devices.

SUMMARY

According to some embodiments, a semiconductor device includes an integrated circuit on a substrate; an interlayer dielectric layer disposed on the substrate; a contact that penetrates the interlayer dielectric layer and has connection with the integrated circuit; a wiring layer disposed on the interlayer dielectric layer and having a wiring line connected to the contact; a first passivation layer disposed on the wiring layer; a first pad and a second pad disposed on the first passivation layer; and a through electrode that penetrates the substrate, the interlayer dielectric layer, the wiring layer, and the first passivation layer, the through electrode being connected to the first pad. The first pad may include: a first head part disposed on the first passivation layer; and a protruding part that extends into the first passivation layer from the first head part and surrounds a lateral surface of the through electrode in the first passivation layer. The second pad may be connected to the integrated circuit through the wiring line and the contact.

According to some embodiments, a semiconductor device includes a substrate that includes an integrated circuit and a contact electrically connected to the integrated circuit; an interlayer dielectric layer disposed on the substrate, the interlayer dielectric layer covering the integrated circuit and the contact; a passivation layer disposed on the interlayer dielectric layer; a first pad and a second pad that are spaced apart from each other in the passivation layer; a wiring pattern that connects the contact and the second pad to each other between the interlayer dielectric layer and the passivation layer; a through electrode spaced apart from the contact and the wiring pattern, the through electrode penetrating the substrate and the interlayer dielectric layer and having connection with the first pad; and a third pad disposed on a bottom surface of the substrate and connected to the through electrode. A portion of the first pad may cover a lateral surface of the through electrode. An uppermost end of the wiring pattern may be at a level lower than a level of an uppermost end of the through electrode.

According to some embodiments, a method of fabricating a semiconductor device includes forming an interlayer dielectric layer that covers a substrate including an integrated circuit and a contact electrically connected to the integrated circuit; forming a plurality of wiring layers stacked on the interlayer dielectric layer; forming a lower passivation layer on the wiring layers; forming a through electrode that penetrates a portion of the substrate, the interlayer dielectric layer, the wiring layers, and the lower passivation layer; forming an upper passivation layer on the lower passivation layer and the through electrode; performing on the upper passivation layer an etching process to form a first opening that exposes the through electrode and a second opening that exposes a wiring pattern of the wiring layers; and filling the first and second openings with a conductive material to form a first pad connected to the through electrode and a second pad connected to the wiring pattern of the wiring layers.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
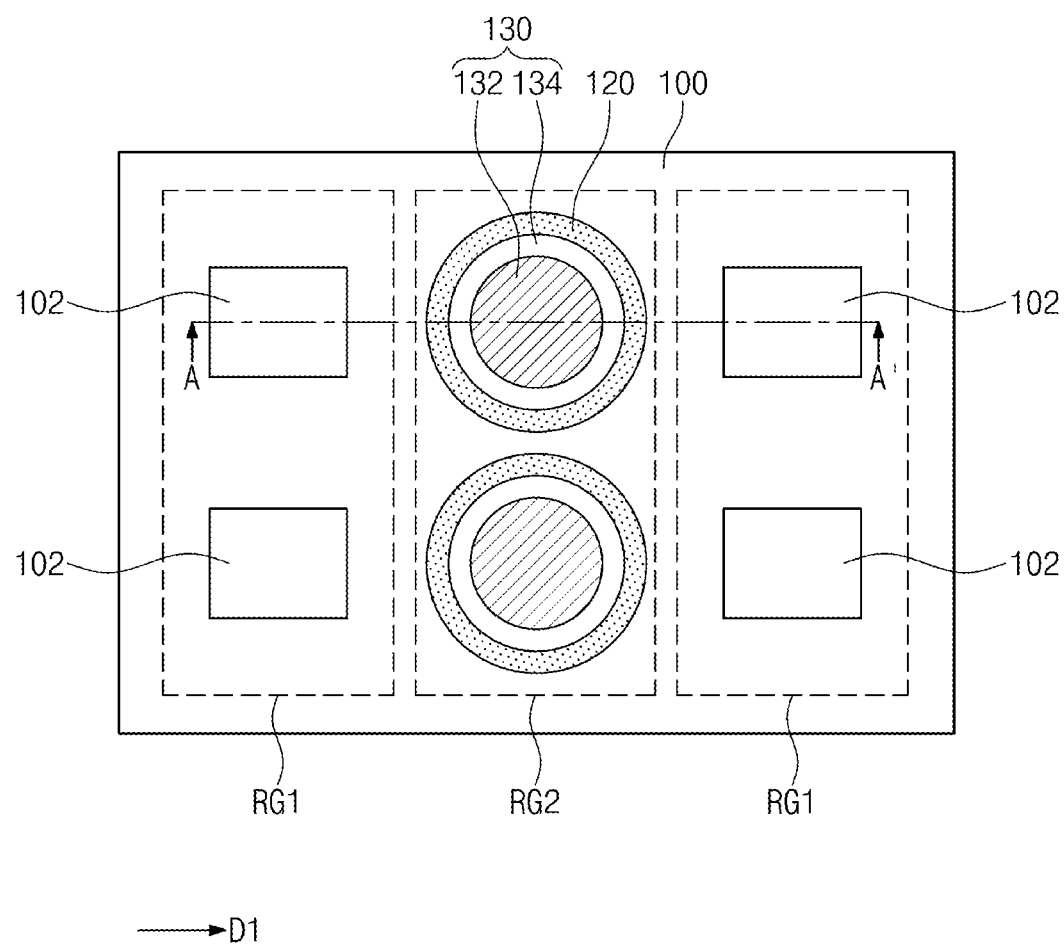
FIG. 1 is a plan view of a semiconductor device according to embodiments.
Figure 2:
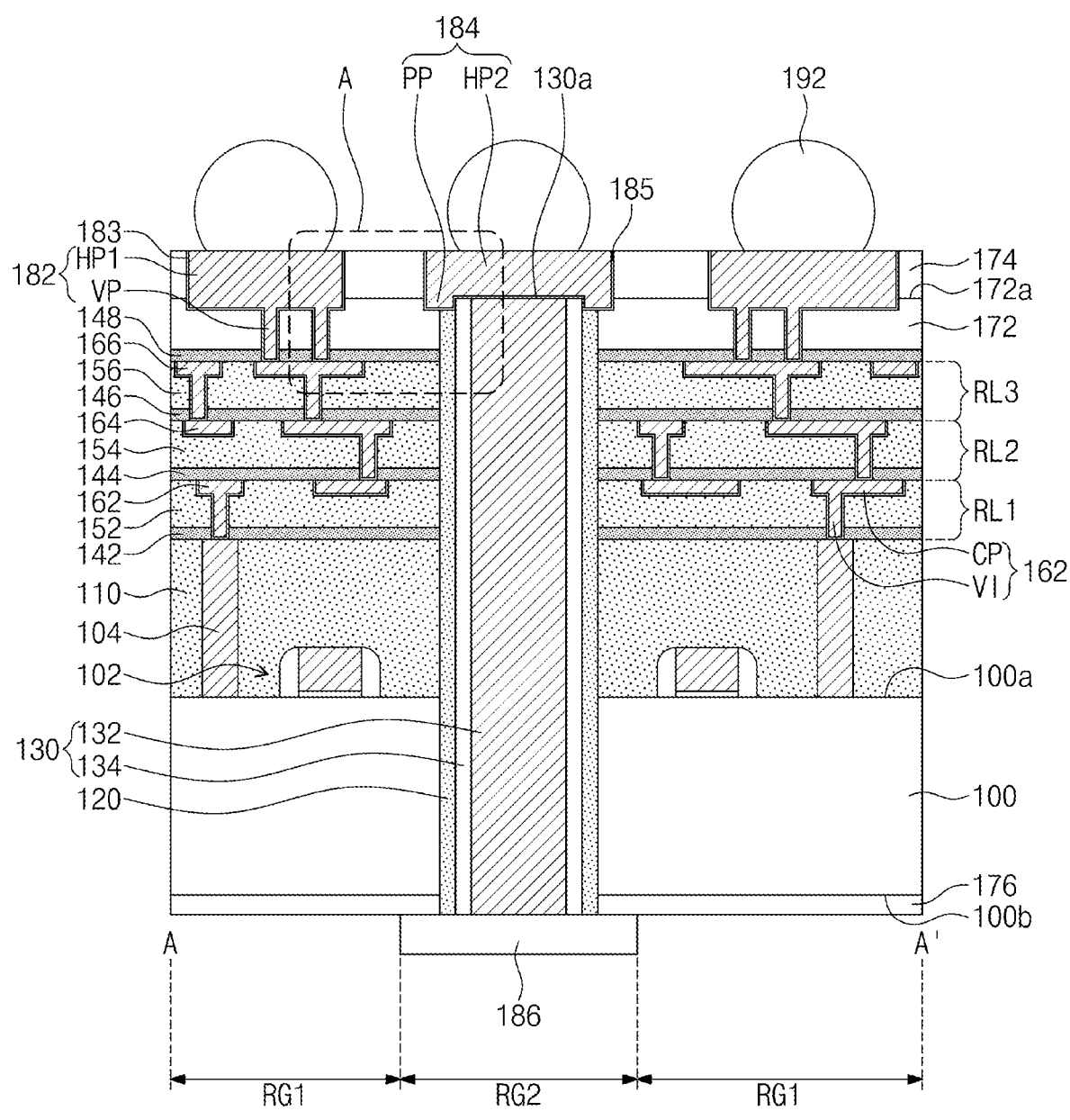
FIG. 2 is a cross-sectional view of a semiconductor device according to some embodiments.
Figure 3:
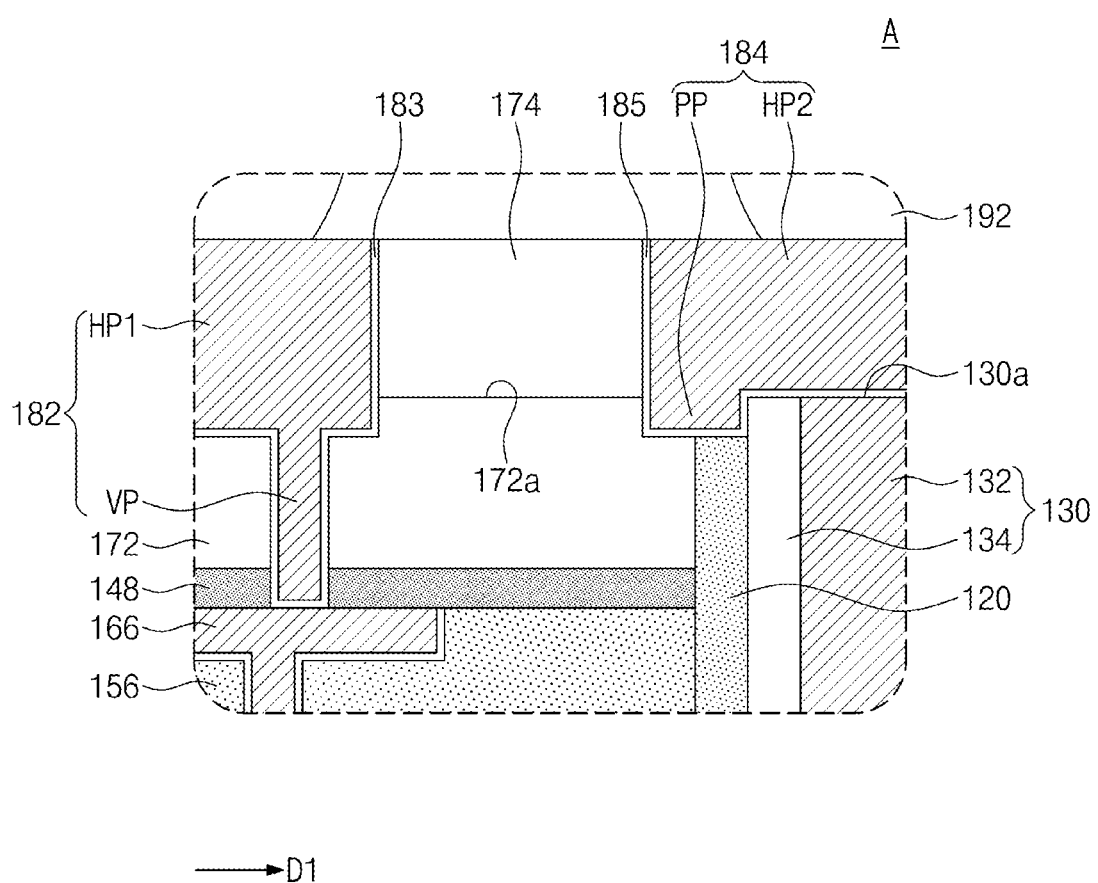
FIGS. 3 and 4 are enlarged views of section A of FIG. 2.
Figure 4:
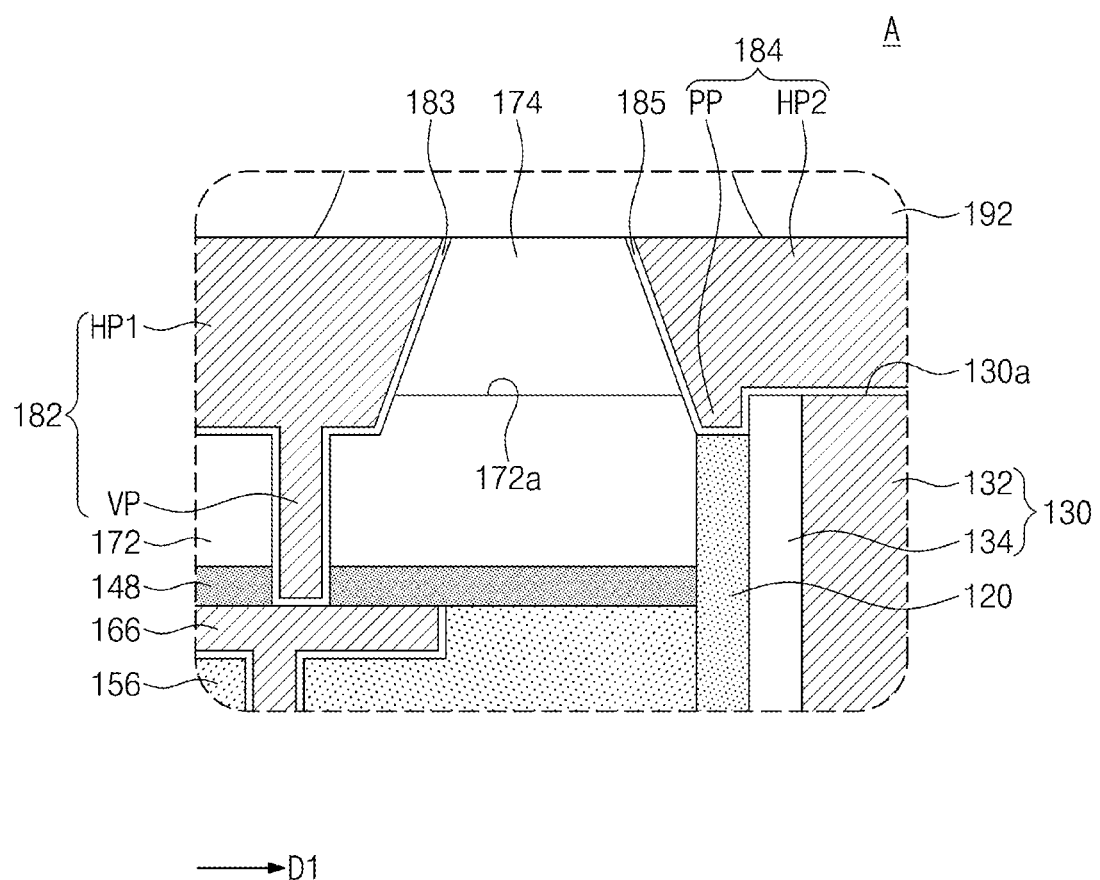

FIG. 1 is a plan view of a semiconductor device according to some embodiments. FIG. 2 is a cross-sectional view along line A-A' of FIG. 1. FIGS. 3 and 4 are enlarged views of section A of FIG. 2.

Referring to FIGS. 1 and 2, a substrate 100 may be provided. The substrate 100 may have a top surface 100a and a bottom surface 100b opposite to the top surface 100a. The top surface 100a may be an active surface of the substrate 100, and the bottom surface 100b may be an inactive surface of the substrate 100. The substrate 100 may be a compound semiconductor substrate or a semiconductor substrate including, e.g., silicon, germanium, silicon-germanium, or the like. For example, the substrate 100 may be a silicon substrate. The substrate 100 may have a first region RG1 and a second region RG2 that is positioned in a first direction D1 from the first region RG1, e.g., the first and second regions RG1 and RG2 may be adjacent to each other in the first direction D1. The first region RG1 may correspond to a zone on which is provided an integrated circuit 102, which will be discussed below, and the second region RG2 may correspond to a zone for vertical connection of a semiconductor device. As shown in FIGS. 1 and 2, another first region RG1 may be located in the first direction D1 from the second region RG2, e.g., the second region RG2 may be between two first regions RG1. Embodiments, however, are not limited thereto, e.g., the first region RG1 may be provided on only one side of the second region RG2 or on various positions around the second region RG2. For convenience of description, the following will discuss components on a single first region RG1 of a semiconductor device. When the first region RG1 is provided in plural, a description of the single first region RG1 may be identically applicable to one or more remaining first regions RG1.

The integrated circuit 102 may be provided on the top surface 100a of the substrate 100. The integrated circuit 102 may be positioned on the first region RG1 of the substrate 100. The integrated circuit 102 may include, e.g., a memory circuit, a logic circuit, or a combination thereof. For example, as illustrated in FIG. 2, the integrated circuit 102 may be a planar type transistor. In another example, the integrated circuit 102 may include a gate-all-around (GAA) type transistor or a vertical type transistor. In yet another example, the integrated circuit 102 may include a combination of a plurality of transistors. The integrated circuit 102 may include not only the transistor, but various passive elements, e.g., resistors or capacitors.

An interlayer dielectric layer 110 may be provided on the substrate 100, e.g., the interlayer dielectric layer 110 may be on the top surface 100a of the substrate 100 to directly cover components of the integrated circuit 102. For example, the integrated circuit 102 may be buried by the interlayer dielectric layer 110. The interlayer dielectric layer 110 may include, e.g., a silicon oxide (SiO) layer, a silicon nitride (SiN) layer, and/or a tetraethylorthosilicate (TEOS) oxide layer.

At least one contact 104 may be provided in the interlayer dielectric layer 110. The contact 104 may be positioned on the first region RG1. The contact 104 may vertically penetrate the interlayer dielectric layer 110 to contact the top surface 100a of the substrate 100, and may have an electrical connection with the substrate 100 or the integrated circuit 102. For example, when the integrated circuit 102 includes a transistor, the contact 104 may be connected to a source or a drain of the transistor. The contact 104 may include metal, e.g., copper (Cu), tungsten (W), aluminum (Al), or any combination thereof. For example, as illustrated in FIG. 2, the contact 104 may have a pillar shape. In another example, the contact 104 may include a plurality of sub-contacts positioned at different levels, and may also include a plurality of wiring lines that intervene between and connect the plurality of sub-contacts.

One or more wiring layers RL1, RL2, and RL3 may be provided on the interlayer dielectric layer 110. The wiring layers RL1, RL2, and RL3 may be sequentially stacked on a top surface of the interlayer dielectric layer 110. For example, as illustrated in FIG. 2, three wiring layers RL1, RL2, and RL3 may be stacked on the interlayer dielectric layer 110, but embodiments are not limited thereto, e.g., one, two, or four or more wiring layers may be provided based on integration or line density in a semiconductor device. The following will focus on the embodiment of FIG. 2. The wiring layers RL1, RL2, and RL3 may include corresponding capping layers 142, 144, and 146, corresponding intermetal dielectric layers 152, 154, and 156, and corresponding wiring patterns 162, 164, and 166.

A first wiring layer RL1 may include a first capping layer 142, a first intermetal dielectric layer 152, and a first wiring pattern 162.

The first capping layer 142 may be provided on the interlayer dielectric layer 110. The first capping layer 142 may cover a top surface of the interlayer dielectric layer 110 and a top surface of the contact 104. The first capping layer 142 may include, e.g., a silicon nitride (SiN) layer. Alternatively, the first capping layer 142 may include a dielectric whose dielectric constant is low, e.g., silicon carbonitride (SiCN), to prevent diffusion of metallic components included in the contact 104.

The first intermetal dielectric layer 152 may be provided on the first capping layer 142. The first intermetal dielectric layer 152 may cover a top surface of the first capping layer 142. The first intermetal dielectric layer 152 may include, e.g., a silicon oxide (SiO) layer or a silicon nitride (SiN) layer. For example, the first intermetal dielectric layer 152 may include a tetraethylorthosilicate (TEOS) oxide layer.

The first wiring pattern 162 may be provided in the first intermetal dielectric layer 152. The first wiring pattern 162 may be positioned on the first region RG1 of the substrate 100. The first wiring pattern 162 may penetrate the first intermetal dielectric layer 152 and the first capping layer 142, and may contact the contact 104 and an internal wiring pattern. The first wiring pattern 162 may include metal, e.g., copper (Cu), tungsten (W), or aluminum (Al), or may include an intermetallic compound, e.g., copper (Cu), tungsten (W), and aluminum (Al).

The first wiring pattern 162 may have a damascene structure. For example, the first wiring pattern 162 may include a first conductive pattern CP that constitutes a horizontal redistribution line in the first intermetal dielectric layer 152 on the first region RG1, and may also include a first wiring via VI that vertically penetrates the first intermetal dielectric layer 152 and the first capping layer 142 to come into connection with a bottom surface of the first conductive pattern CP. A top surface of the first conductive pattern CP may be exposed on a top surface of the first intermetal dielectric layer 152. The top surface of the first conductive pattern CP may be coplanar with the top surface of the first intermetal dielectric layer 152. The first wiring via VI may penetrate the first intermetal dielectric layer 152 and the first capping layer 142, and may connect the first conductive pattern CP to the contact 104. The first conductive pattern CP may be provided on and connected to the first wiring via VI, and the first conductive pattern CP and the first wiring via VI may constitute a single piece. The first conductive pattern CP may have a width greater than that of the first wiring via VI. In this sense, the first conductive pattern CP and the first wiring via VI may be integrally connected to have a T-shaped cross-section.

A first seed/barrier pattern may be provided between the first wiring pattern 162 and the first intermetal dielectric layer 152. The first seed/barrier pattern may surround lateral and bottom surfaces of the first wiring pattern 162. For example, the first seed/barrier pattern may cover lateral and bottom surfaces of the first conductive pattern CP, and may also cover lateral and bottom surfaces of the first wiring via VI. The first seed/barrier pattern may serve as either a seed layer to form the first wiring pattern 162 in fabricating a semiconductor device or a barrier layer to prevent constituents from diffusing between the first wiring pattern 162 and the first intermetal dielectric layer 152. The first seed/barrier pattern may include only one of the seed layer and the barrier layer, or may be a multiple layer including all of the seed layer and the barrier layer. The seed layer may include, e.g., gold (Au), silver (Ag), nickel (Ni), tungsten (W), or the like. The barrier layer may include, e.g., a metal nitride layer or a multiple layer of a metal layer and a metal nitride layer. The metal nitride layer may include, e.g., at least one of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. The first seed/barrier pattern may not be provided if necessary.

A second wiring layer RL2 may have a configuration similar to that of the first wiring layer RL1. For example, the second wiring layer RL2 may include a second capping layer 144, a second intermetal dielectric layer 154, and a second wiring pattern 164.

The second capping layer 144 may be provided on the first intermetal dielectric layer 152 of the first wiring layer RL1. The second capping layer 144 may cover a top surface of the first intermetal dielectric layer 152 and a top surface of the first wiring pattern 162. The second capping layer 144 may include a silicon nitride (SiN) layer. Alternatively, the second capping layer 144 may include a dielectric whose dielectric constant is low to prevent diffusion of metallic components included in the first wiring pattern 162.

The second intermetal dielectric layer 154 may be provided on the second capping layer 144. The second intermetal dielectric layer 154 may cover a top surface of the second capping layer 144. The second intermetal dielectric layer 154 may include, e.g., a silicon oxide (SiO) layer or a silicon nitride (SiN) layer. For example, the second intermetal dielectric layer 154 may include a tetraethylorthosilicate (TEOS) oxide layer.

The second wiring pattern 164 may be provided in the second intermetal dielectric layer 154. The second wiring pattern 164 may be positioned on the first region RG1 of the substrate 100. The second wiring pattern 164 may penetrate the second intermetal dielectric layer 154 and the second capping layer 144, and may contact the first wiring pattern 162. The second wiring pattern 164 may include metal, e.g., copper (Cu), tungsten (W), or aluminum (Al), or may include an intermetallic compound, e.g., any combination of copper (Cu), tungsten (W), and aluminum (Al).

The second wiring pattern 164 may have a damascene structure. For example, the second wiring pattern 164 may include a second conductive pattern that constitutes a horizontal redistribution line in the second intermetal dielectric layer 154 on the first region RG1, and may also include a second wiring via that vertically penetrates the second intermetal dielectric layer 154 and the second capping layer 144 to come into connection with a bottom surface of the second conductive pattern. A top surface of the second conductive pattern may be exposed on a top surface of the second intermetal dielectric layer 154. The top surface of the second conductive pattern may be coplanar with the top surface of the second intermetal dielectric layer 154. The second wiring via may penetrate the second intermetal dielectric layer 154 and the second capping layer 144, and may connect the second conductive pattern to the first conductive pattern CP.

A second seed/barrier pattern including a seed layer and a barrier layer may be provided between the second wiring pattern 164 and the second intermetal dielectric layer 154. The second seed/barrier pattern may surround lateral and bottom surfaces of the second wiring pattern 164. The second seed/barrier pattern may include only one of the seed layer and the barrier layer, or may be a multiple layer including all of the seed layer and the barrier layer. The second seed/barrier pattern may not be provided if necessary.

A third wiring layer RL3 may have a configuration similar to that of the first wiring layer RL1 or that of the second wiring layer RL2. For example, the third wiring layer RL3 may include a third capping layer 146, a third intermetal dielectric layer 156, and a third wiring pattern 166.

The third capping layer 146 may be provided on the second intermetal dielectric layer 154 of the second wiring layer RL2. The third capping layer 146 may cover a top surface of the second intermetal dielectric layer 154 and a top surface of the second wiring pattern 164. The third capping layer 146 may include a silicon nitride (SiN) layer. Alternatively, the third capping layer 146 may include a dielectric whose dielectric constant is low to prevent diffusion of metallic components included in the second wiring pattern 164.

The third intermetal dielectric layer 156 may be provided on the third capping layer 146. The third intermetal dielectric layer 156 may cover a top surface of the third capping layer 146. The third intermetal dielectric layer 156 may include, e.g., a silicon oxide (SiO) layer or a silicon nitride (SiN) layer. For example, the third intermetal dielectric layer 156 may include a tetraethylorthosilicate (TEOS) oxide layer.

The third wiring pattern 166 may be provided in the third intermetal dielectric layer 156. The third wiring pattern 166 may be positioned on the first region RG1 of the substrate 100. The third wiring pattern 166 may penetrate the third intermetal dielectric layer 156 and the third capping layer 146, and may contact the second wiring pattern 164. The third wiring pattern 166 may include metal, e.g., copper (Cu), tungsten (W), aluminum (Al), or any combination thereof.

The third wiring pattern 166 may have a damascene structure. For example, the third wiring pattern 166 may include a third conductive pattern that constitutes a horizontal redistribution line in the third intermetal dielectric layer 156 on the first region RG1, and may also include a third wiring via that vertically penetrates the third intermetal dielectric layer 156 and the third capping layer 146 to come into connection with a bottom surface of the third conductive pattern. A top surface of the third conductive pattern may be exposed on a top surface of the third intermetal dielectric layer 156. The top surface of the third conductive pattern may be coplanar with the top surface of the third intermetal dielectric layer 156. The third wiring via may penetrate the third intermetal dielectric layer 156 and the third capping layer 146 and may connect the third conductive pattern to the second conductive pattern.

A third seed/barrier pattern including a seed layer and a barrier layer may be provided between the third wiring pattern 166 and the third intermetal dielectric layer 156. The third seed/barrier pattern may surround lateral and bottom surfaces of the third wiring pattern 166. The third seed/barrier pattern may include only one of the seed layer and the barrier layer, or may be a multiple layer including all of the seed layer and the barrier layer. The third seed/barrier pattern may not be provided if necessary.

A fourth capping layer 148 may be provided on the third wiring layer RL3. The fourth capping layer 148 may cover a top surface of the third intermetal dielectric layer 156 and a top surface of the third wiring pattern 166. The fourth capping layer 148 may include, e.g., a silicon nitride (SiN) layer. Alternatively, the fourth capping layer 148 may include a dielectric whose dielectric constant is low, e.g., silicon carbonitride (SiCN), to prevent diffusion of metallic components from the third wiring pattern 166.

A first upper passivation layer 172 may be provided on the fourth capping layer 148. The first upper passivation layer 172 may cover a top surface of the fourth capping layer 148. The first upper passivation layer 172 may include a dielectric, e.g., a silicon oxide (SiO) layer, a silicon nitride (SiN) layer, or a polymer. For example, the first upper passivation layer 172 may include a tetraethylorthosilicate (TEOS) oxide layer.

A through electrode 130 may be provided in the substrate 100, the interlayer dielectric layer 110, the first, second, and third wiring layers RL1, RL2, and RL3, and the first upper passivation layer 172. The through electrode 130 may be positioned on the second region RG2 of the substrate 100. The through electrode 130 may vertically, e.g., and continuously, penetrate the, e.g., entire thickness of each of the, substrate 100, the interlayer dielectric layer 110, the first, second, and third wiring layers RL1, RL2, and RL3, and the first upper passivation layer 172. The through electrode 130 may have a pillar shape that extends in the vertical direction, e.g., along a direction normal to the top surface 100a of the substrate 100. In this case, the through electrode 130 may be spaced apart a certain distance, e.g., along the first direction D1, from the integrated circuit 102, the contact 104, and the first, second, and third wiring patterns 162, 164, and 166.

The through electrode 130 may have a bottom surface exposed on, e.g., through, the bottom surface 100b of the substrate 100. The through electrode 130 may have a top surface 130a exposed on, e.g., through, a top surface 172a of the first upper passivation layer 172. In this case, the top surface 130a of the through electrode 130 may be located at the same level as that of the top surface 172a of the first upper passivation layer 172. The top surface 130a of the through electrode 130 may be coplanar, e.g., level, with the top surface 172a of the first upper passivation layer 172. The top surface 130a of the through electrode 130 may be located at a higher level than that of the top surface of the third wiring pattern 166, e.g., relative to the top surface 100a of the substrate 100. The through electrode 130 may include at least one metal, e.g., aluminum (Al), copper (Cu), tungsten (W), molybdenum (Mo), and cobalt (Co).

The through electrode 130 may include a barrier layer 134 on an outer wall of the through electrode 130. The barrier layer 134 may surround a conductive part 132 of the through electrode 130. The through electrode 130 may include a metallic segment that is surrounded by the barrier layer 134, and the conductive part 132 may indicate the metallic segment of the through electrode 130. For example, the barrier layer 134 may cover an, e.g., entire, outer wall of the conductive part 132 included in the through electrode 130. The barrier layer 134 may prevent a constituent (e.g., copper (Cu)) of the conductive part 132 from diffusing from the through electrode 130 toward the substrate 100 or the integrated circuit 102. The barrier layer 134 may include a metal nitride layer or a multiple layer of a metal layer and a metal nitride layer. The metal nitride layer may include at least one of, e.g., a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. The barrier layer 134 may not be provided if necessary.

A seed layer may be provided between the through electrode 130 and the first upper passivation layer 172, between the through electrode 130 and the first to third wiring layers RL1 to RL3, between the through electrode 130 and the interlayer dielectric layer 110, and between the through electrode 130 and the substrate 100. The seed layer may include, e.g., gold (Au), nickel (Ni), or the like. The seed layer may not be provided if necessary.

A through-electrode dielectric layer 120 may be, e.g., continuously, interposed between the through electrode 130 and the first upper passivation layer 172, between the through electrode 130 and, e.g., each of, the first to third wiring layers RL1 to RL3, between the through electrode 130 and the interlayer dielectric layer 110, and between the through electrode 130 and the substrate 100. The through-electrode dielectric layer 120 may surround, e.g., an entire perimeter of, the, outer wall of the through electrode 130. In this case, the through-electrode dielectric layer 120 may expose a portion of the outer wall of the through electrode 130. For example, the through-electrode dielectric layer 120 may have a top surface at a lower level than that of the top surface 130a of the through electrode 130, e.g., relative to the top surface 100a of the substrate 100, and may not cover an outer lateral surface at an upper portion of the through electrode 130. The through-electrode dielectric layer 120 may separate the through electrode 130 from the substrate 100, the interlayer dielectric layer 110, the first to third wiring layers RL1 to RL3, and the first upper passivation layer 172. The through-electrode dielectric layer 120 may not be provided if necessary.

A second upper passivation layer 174 may be provided on the first upper passivation layer 172. The second upper passivation layer 174 may cover the top surface 172a of the first upper passivation layer 172. The second upper passivation layer 174 may include the same material as that of the first upper passivation layer 172. The second upper passivation layer 174 may include a dielectric, e.g., a silicon oxide (SiO) layer, a silicon nitride (SiN) layer, or a polymer.

A first upper pad 182 and a second upper pad 184 may be provided in the second upper passivation layer 174. On the first upper passivation layer 172, the first upper pad 182 and the second upper pad 184 may be buried in the second upper passivation layer 174. The first upper pad 182 and the second upper pad 184 may be exposed on a top surface of the second upper passivation layer 174. The first upper pad 182 and the second upper pad 184 may correspond to pads to which upper terminals 192 are coupled as discussed below.

On the first region RG1, the first upper pad 182 may be located in the second upper passivation layer 174. The first upper pad 182 may be exposed on the top surface of the second upper passivation layer 174, and may penetrate the first upper passivation layer 172 and the fourth capping layer 148. The first upper pad 182 may have an electrical connection with the third wiring pattern 166. The first upper pad 182 may be connected to the integrated circuit 102 through the contact 104 and the first, second, and third wiring patterns 162, 164, and 166. In FIGS. 2 and 3, the first upper pad 182 is illustrated as a pad shape, but embodiments are not limited thereto. The first upper pad 182 may include a metallic material, e.g., copper (Cu).

The first upper pad 182 may have a damascene structure. For example, the first upper pad 182 may include a first head part HP1 positioned on the first upper passivation layer 172, and may also include a via part VP that penetrates the first upper passivation layer 172 and has a, e.g., direct, connection with the first head part HP1. The first head part HP1 and the via part VP may be provided in the form of a single, e.g., integral and seamless, piece. For example, the first head part HP1 and the via part VP may be portions of the first upper pad 182. For convenience in this description, the first head part HP1 and the via part VP will be discussed as separate components.

On the first upper passivation layer 172, the first head part HP1 may be provided in the second upper passivation layer 174. When viewed in a plan view, the first head part HP1 may be surrounded by the second upper passivation layer 174. A portion of the first head part HP1 may be buried in the first upper passivation layer 172. For example, the first head part HP1 may have a bottom surface at a lower level than that of the top surface 172*a* of the first upper passivation layer 172, e.g., relative to the top surface 100*a* of the substrate 100. In this description, the top surface 172*a* of the first upper passivation layer 172 refers to one of surfaces of the first upper passivation layer 172 that is exposed on a side of the first upper pad 182 or the second upper pad 184, e.g., an uppermost surface of the first upper passivation layer 172 that is lower than the upper surface of the second upper passivation layer 174 and extends between sides of the first and second upper pads 182 and 184. The first head part HP1 may have a top surface exposed on, e.g., through, the top surface of the second upper passivation layer 174. The top surface of the first head part HP1 may be coplanar, e.g., level, with the top surface of the second upper passivation layer 174. The first head part HP1 may have a width that is constant regardless of distance from the substrate 100.

The via part VP may vertically penetrate the first upper passivation layer 172 and the fourth capping layer 148 to connect the first head part HP1 to the third wiring pattern 166. The first head part HP1 may be provided on and connected to the via part VP, and the first head part HP1 and the via part VP may constitute a single, e.g., integral and seamless, piece. The via part VP may have a width less than that of the first head part HP1, e.g., in the first direction D1. In this sense, the first head part HP1 and the via part VP may be integrally connected to have a T-shaped cross-section. The through electrode 130 may have a width, e.g., in the first direction D1, that is about 20 times to about 100 times the width of the via part VP, e.g., in the first direction D1. As shown in FIGS. 2 and 3, the via part VP may be provided in plural if necessary. The via part VP may have an uppermost end at a lower level than that of the top surface 172*a* of the first upper passivation layer 172, e.g., relative to the top surface 100*a* of the substrate 100. The width of the via part VP may be constant regardless of distance from the substrate 100. Embodiments, however, are not limited thereto, and the width of the via part VP may be irregular based on distance from the substrate 100.

A first seed layer 183 may be provided between the first upper pad 182 and the first upper passivation layer 172, and between the first upper pad 182 and the second upper passivation layer 174. The first seed layer 183 may surround lateral and bottom surfaces of the first upper pad 182. For example, the first seed layer 183 may cover lateral and bottom surfaces of the first head part HP1, and may also cover lateral and bottom surfaces of the via part VP. The first seed layer 183 may include, e.g., gold (Au), silver (Ag), nickel (Ni), tungsten (W), etc. In addition to the first seed layer 183, a first barrier layer may also be provided between the first upper pad 182 and the first upper passivation layer 172, and between the first upper pad 182 and the second upper passivation layer 174. The first barrier layer may include a metal nitride layer or a multiple layer of a metal layer and a metal nitride layer. The metal nitride layer may include at least one of, e.g., a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

On the second region RG2, the second upper pad 184 may be located in the second upper passivation layer 174. The second upper pad 184 may be exposed on, e.g., through, the top surface of the second upper passivation layer 174 and may be electrically connected to the through electrode 130. For example, the second upper pad 184 may be located on and in contact with the through electrode 130. In FIGS. 2 and 3, the second upper pad 184 is illustrated as a pad shape, but embodiments are not limited thereto. The second upper pad 184 may include a metallic material, e.g., copper (Cu).

The second upper pad 184 may have a damascene structure. For example, the second upper pad 184 may include a second head part HP2 that lies on the first upper passivation layer 172 and a protruding part PP that extends into the first upper passivation layer 172. The second head part HP2 and the protruding part PP may be provided in the form of a single, e.g., integral and seamless, piece. For example, the second head part HP2 and the protruding part PP may be portions of the second upper pad 184. For convenience in this description, the second head part HP2 and the protruding part PP will be discussed as separate components.

On the through electrode 130, the second head part HP2 may be provided in the second upper passivation layer 174. When viewed in a plan view, e.g., an entire perimeter of, the second head part HP2 may be surrounded by the second upper passivation layer 174. The second head part HP2 may have a bottom surface in contact with the top surface 130*a* of the through electrode 130. The bottom surface of the second head part HP2 may be located at the same level as that of the top surface 172*a* of the first upper passivation layer 172 and that of the top surface 130*a* of the through electrode 130. The second head part HP2 may have a planar shape larger than that of the through electrode 130. For example, the second head part HP2 may have a width greater than that of the through electrode 130, e.g., along the first direction D1. When viewed in a cross-section view, the through electrode 130 may be located below a central portion of the second head part HP2. For example, as illustrated in FIG. 2, the through electrode 130 may be centered under the second head part HP2, such that the second head part HP2 may extend laterally beyond the outermost sidewall of the through electrode 130, e.g., beyond the outermost sidewall of the barrier layer 134. For example, as illustrated in FIG. 2, the through electrode 130 may be spaced apart, e.g., along the first direction D1, from a lateral, e.g., outermost side, surface of the second head part HP2.

The second head part HP2 may have a top surface exposed on, e.g., through, the top surface of the second upper passivation layer 174. The top surface of the second head part HP2 may be coplanar with the top surface of the second upper passivation layer 174. The width of the second head part HP2 may be constant regardless of distance from the substrate 100.

The protruding part PP may extend into the first upper passivation layer 172 from the bottom surface of the second head part HP2. The protruding part PP may not completely vertically penetrate the first upper passivation layer 172, e.g., the protruding part PP may extend only partially into the first upper passivation layer 172. For example, the protruding part PP may have a bottom surface located in the first upper passivation layer 172. The bottom surface of the protruding part PP may be located at a higher level than that of a bottom surface of the first upper passivation layer 172 and that of the bottom surface of the via part VP included in the first upper pad 182. In this case, the bottom surface of the protruding part PP may be located at the same level as that of the bottom surface of the first head part HP1 included in the first upper pad 182.

The protruding part PP may extend along a lateral surface of the through electrode 130. For example, when viewed in a plan view, the protruding part PP may surround the, e.g., entire perimeter of the, through electrode 130. In this sense, the protruding part PP may cover the lateral surface at the upper portion of the through electrode 130. When viewed in a plan view, the protruding part PP may have a closed curve shape that surrounds the through electrode 130. For example, when the through electrode 130 has a circular shape when viewed in a plan view, the protruding part PP may have a circular ring shape when viewed in a plan view, or when the through electrode 130 has a tetragonal shape when viewed in a plan view, the through electrode 130 may have a tetragonal ring shape when viewed in a plan view. The protruding part PP may have a width that is constant regardless of distance from the substrate 100. In this description, the width of the protruding part PP may indicate a distance between inner and outer lateral surfaces of the protruding part PP. The outer lateral surface of the protruding part PP may be coplanar with an outer lateral surface of the second head part HP2, e.g., the width of the protruding part PP may equal a distance along the first direction D1 between an outermost side surface of the through electrode 130 and an outermost side surface of the second head part HP2.

The protruding part PP may be in contact with the lateral surface of the through electrode 130. For example, the top surface of the through-electrode dielectric layer 120 may be located at a lower level than that of the top surface 130a of the through electrode 130, the outer lateral surface at the upper portion of the through electrode 130 may be exposed from the through-electrode dielectric layer 120. In this sense, the through electrode 130 may protrude from, e.g., above, the top surface of the through-electrode dielectric layer 120. The top surface of the through-electrode dielectric layer 120 may be located at the same level as that of the bottom surface of the first head part HP1. The bottom surface of the protruding part PP may be in contact with the top surface of the through-electrode dielectric layer 120. The protruding part PP may surround the exposed upper portion of the through electrode 130, and may contact the outer lateral surface at the upper portion of the through electrode 130. A distance between the outer lateral surface of the through electrode 130 and the outer lateral surface of the protruding part PP may be constant regardless of distance from the substrate 100. For example, as illustrated in FIG. 2, a bottom surface of the second upper pad 184, e.g., a combined surface of the second head part HP2 and the protruding part PP facing the through electrode 130, and a combined top surface of the through electrode 130 with the through-electrode dielectric layer 120 may have complementary shapes in a cross-sectional view.

According to some embodiments, the through electrode 130 may penetrate all of, e.g., entire thickness of, the substrate 100, the interlayer dielectric layer 110, and the wiring layers RL1, RL2, and RL3 to directly contact the second upper pad 184 that corresponds to a pad of a semiconductor device. Therefore, an electrical resistance may be reduced between the second upper pad 184 and the through electrode 130. In addition, the second upper pad 184 may be provided to contact not only the top surface 130a of the through electrode 130, but also, e.g., portions of, the outer lateral surface of the through electrode 130, and accordingly a contact resistance may be reduced between the second upper pad 184 and the through electrode 130. As a result, it may be possible to provide a semiconductor device with improved electrical characteristics.

Moreover, because no connection lines are provided between the second upper pad 184 and the through electrode 130, and because the wide through electrode 130 is used alone to achieve an electrical connection to the second upper pad 184, no complex lines are required for electrical connection between the second upper pad 184 and the though electrode 130. Thus, the semiconductor device may be strongly resistant to external impact. Furthermore, as the wide through electrode 130 vertically penetrates the wiring layers RL1, RL2, and RL3, the through electrode 130 may prevent propagation of external stress and strain toward connection lines of the wiring layers RL1, RL2, and RL3. Hence, the semiconductor device may be strong against external impact and may increase in structural stability.

A second seed layer 185 may be provided between the second upper pad 184 and the first upper passivation layer 172, between the second upper pad 184 and the second upper passivation layer 174, and between the second upper pad 184 and the through electrode 130. The second seed layer 185 may surround lateral and bottom surfaces of the second upper pad 184. For example, the second seed layer 185 may cover the lateral and bottom surfaces of the second head part HP2 and the lateral and bottom surfaces of the protruding part PP. The second seed layer 185 may include, e.g., gold (Au), silver (Ag), nickel (Ni), tungsten (W), etc. In addition to the second seed layer 185, a second barrier layer may also be provided between the second upper pad 184 and the first upper passivation layer 172, between the second upper pad 184 and the second upper passivation layer 174, and between the second upper pad 184 and the through electrode 130. The second barrier layer may include a metal nitride layer or a multiple layer of a metal layer and a metal nitride layer. The metal nitride layer may include at least one of, e.g., a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

According to some embodiments, as shown in FIG. 4, the first and second head parts HP1 and HP2 of the first and second upper pads 182 and 184, respectively, may each have a width that decreases with a decreasing distance from the substrate 100. In this case, the protruding part PP may also have a width that decreases with a decreasing distance from the substrate 100. In this sense, a distance between the outer lateral surface of the through electrode 130 and the outer lateral surface of the protruding part PP may decrease with a decreasing distance from the substrate 100. The outer lateral surface of the protruding part PP may be coplanar with an outer lateral surface of the second head part HP2. For example, the outer lateral surface of the protruding part PP and the outer lateral surface of the second head part HP2 may constitute a single inclined surface relative to the top surface 172a of the first upper passivation layer 172. The following will focus on the embodiment of FIGS. 1 to 3.

The upper terminals 192 may be provided on the first upper pad 182 and the second upper pad 184. The upper terminals 192 may be connection terminals for connecting a semiconductor device to an external apparatus. For example, the upper terminals 192 may be solder balls.

A lower passivation layer 176 may be provided below the substrate 100. The lower passivation layer 176 may cover the bottom surface 100b of the substrate 100. In this case, the lower passivation layer 176 may expose a bottom surface of the through electrode 130. For example, the through electrode 130 may vertically penetrate the first upper passivation layer 172, the first, second, and third wiring layers RL1, RL2, and RL3, the interlayer dielectric layer 110, the substrate 100, and the lower passivation layer 176.

A lower pad 186 may be provided below the lower passivation layer 176. The lower passivation layer 176 may be provided on its bottom surface with the lower pad 186 that covers, e.g., overlaps, the bottom surface of the through electrode 130. The lower pad 186 may be electrically connected to the through electrode 130. In FIG. 2, the lower pad 186 is illustrated as a pad shape, but embodiments are not limited thereto. The lower pad 186 may be shaped like a solder ball coupled to the through electrode 130.

Figure 5:
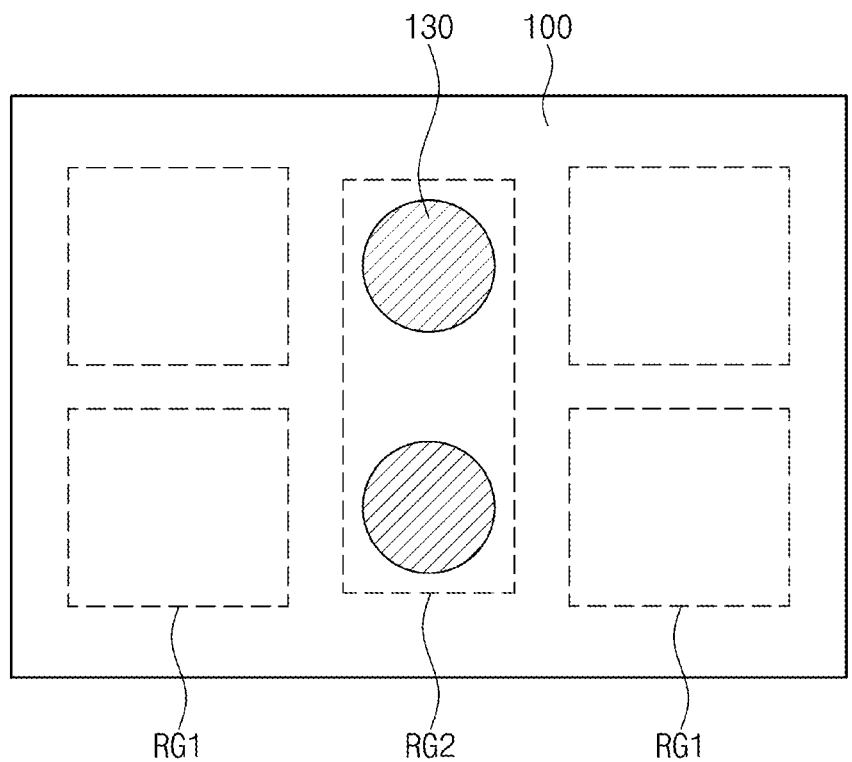
FIG. 5 is a simplified plan view of a semiconductor device according to some embodiments.

FIG. 5 is a simplified plan view of a semiconductor device according to some embodiments.

Referring to FIG. 5, a logic chip may be provided. The logic chip may include first regions RG1 on the substrate 100. For example, the first regions RG1 may be logic cell areas. The first regions RG1 may be two-dimensionally arranged on the substrate 100. Each of the first regions RG1 may be a zone, e.g., an area, on which logic cells included in a logic circuit are disposed. The first regions RG1 depicted in FIG. 5 may each be, e.g., a single logic cell.

The logic chip may further include a second region RG2 adjacent to the first regions RG1. The second region RG2 may be a connection area. The first regions RG1 may be located on one side of the second region RG2 or may surround the second region RG2. At least one through electrode 130 may be provided on the second region RG2.

Figure 6:
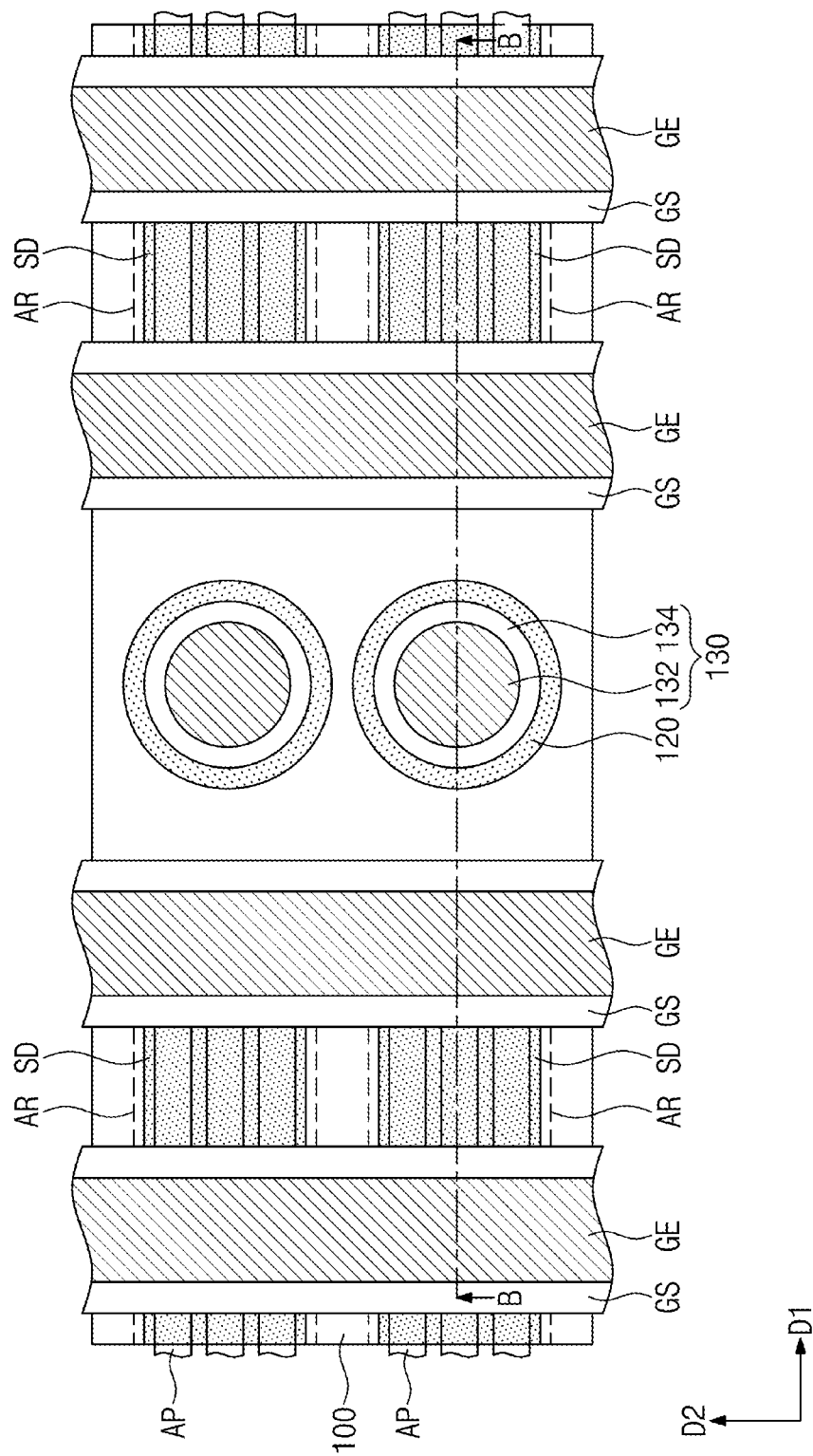
FIG. 6 is an enlarged plan view of first and second regions of FIG. 5.
Figure 7:
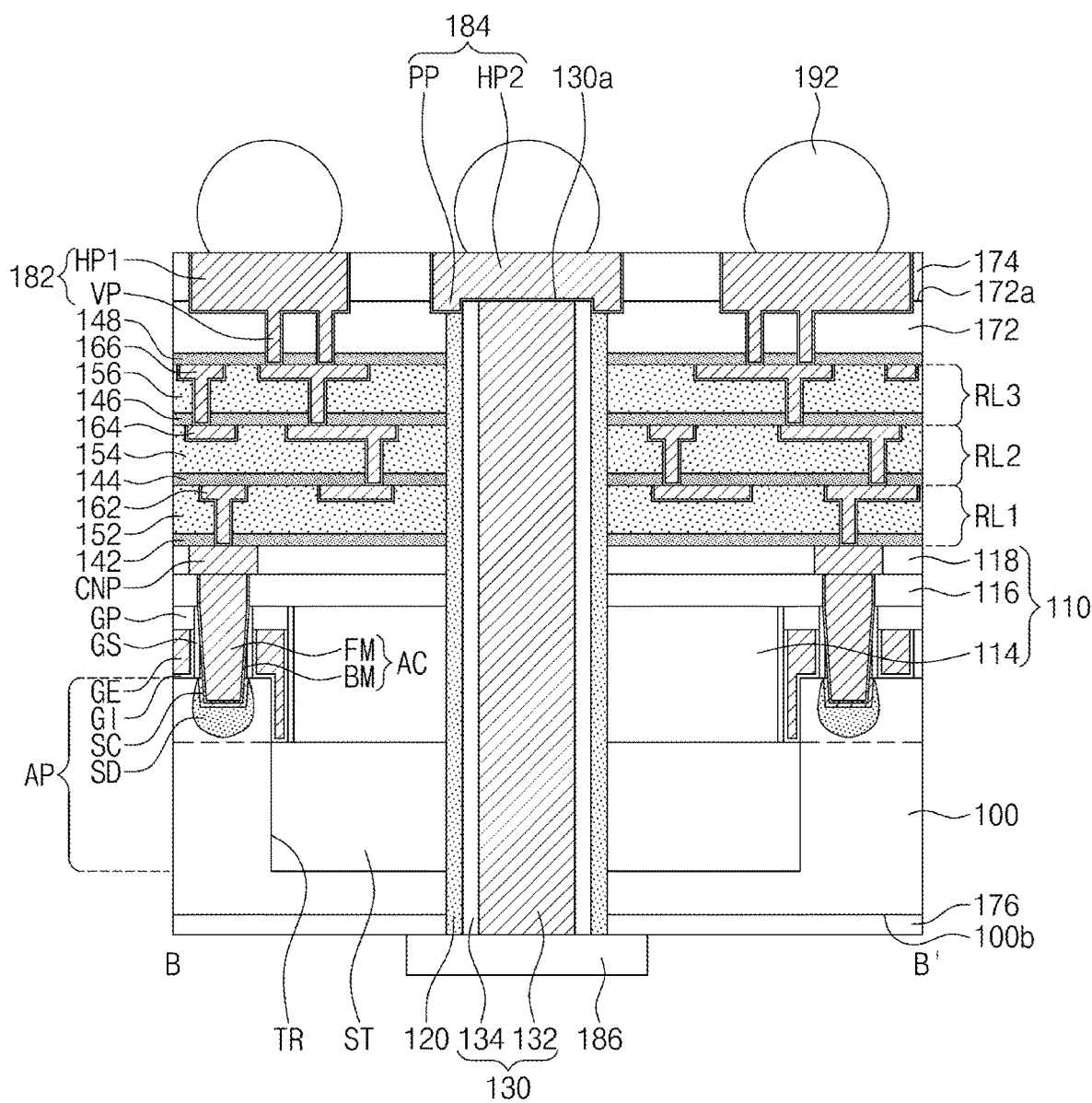
FIG. 7 is a cross-sectional view of a semiconductor device according to some embodiments.

FIG. 6 is an enlarged plan view of the first and second regions RG1 and RG2 of FIG. 5. FIG. 7 is a cross-sectional view along line B-B' of FIG. 6.

Referring to FIGS. 6 and 7, the substrate 100 may include active regions AR.

For example, each of the active regions AR may be a PMOSFET area or an NMOSFET area. The substrate 100 may be a compound semiconductor substrate or a semiconductor substrate including, e.g., silicon (Si), germanium (Ge), or silicon-germanium (SiGe). For example, the substrate 100 may be a silicon substrate.

The active regions AR may be defined on an upper portion of the substrate 100. The active regions AR may be spaced apart from each other in a second direction D2. Each of the active regions AR may extend in the first direction D1.

Active patterns AP may be provided on the active regions AR. The active patterns AP may be parallel and extend in the first direction D1. The active patterns AP may be portions of the substrate 100 that protrude upward from the substrate 100. Neighboring active patterns AP may be spaced apart from each other across a trench TR positioned therebetween.

A device isolation layer ST may fill spaces between the active regions AR and spaces between the active patterns AP. For example, the device isolation layer ST may fill the trench TR that separates neighboring active patterns AP from each other. The device isolation layer ST may include, e.g., a silicon oxide (SiO) layer. The active patterns AP may have their upper portions that vertically protrude from the device isolation layer ST. Each of the upper portions of the active patterns AP may have a fin shape. The device isolation layer ST may not cover the upper portions of the active patterns AP. The device isolation layer ST may cover sidewalls at lower portions of the active patterns AP.

Source/drain patterns SD may be provided on the upper portions of the active patterns AP. The source/drain patterns SD may be impurity regions having a first conductivity type. For example, the first conductivity type may be p-type. A channel pattern may be interposed between a pair of source/drain patterns SD. The source/drain patterns SD may be epitaxial patterns formed by a selective epitaxial growth process. For example, the source/drain patterns SD may have their top surfaces coplanar with those of the channel patterns. For another example, the source/drain patterns SD may have their top surfaces higher than those of the channel patterns.

Gate electrodes GE may be provided to extend in the second direction D2, while running across the active patterns AP. The gate electrodes GE may be arranged at a regular pitch along the first direction D1. The gate electrodes GE may vertically overlap the channel patterns. Each of the gate electrodes GE may surround a top surface and opposite sidewalls of each of the channel patterns.

A pair of gate spacers GS may be located on opposite sidewalls of each of the gate electrodes GE. The gate spacers GS may extend in the second direction D2 along the gate electrodes GE. The gate spacers GS may have their top surfaces higher than those of the gate electrodes GE. The top surfaces of the gate spacers GS may be coplanar with that of a first interlayer dielectric layer 114 which will be discussed below. The gate spacers GS may include at least one of, e.g., silicon carbonitride (SiCN), silicon carbon oxynitride (SiCON), and silicon nitride (SiN).

A gate capping pattern GP may be provided on each of the gate electrodes GE. The gate capping pattern GP may extend in the second direction D2 along the gate electrode GE. The gate capping pattern GP may include a material having an etch selectivity with respect to first and second interlayer dielectric layers 114 and 116 which will be discussed below. For example, the gate capping patterns GP may include at least one of, e.g., silicon oxynitride (SiON), silicon carbonitride (SiCN), silicon carbon oxynitride (SiCON), and silicon nitride (SiN).

A gate dielectric layer GI may be provided between the gate electrode GE and the active pattern AP. The gate dielectric layer GI may extend along a bottom surface of the gate electrode GE positioned on the gate dielectric layer GI. The gate dielectric layer GI may cover a top surface of the device isolation layer ST below the gate electrode GE. The gate dielectric layer GI may include a high-k dielectric material whose dielectric constant is greater than that of a silicon oxide layer. For example, the high-k dielectric material may include hafnium oxide ($HfO_2$), hafnium zirconium oxide ($HfZrO_2$), zirconium oxide ($ZrO_2$), zirconium silicon oxide ($ZrSiO_4$), tantalum oxide (TaO), or titanium oxide (TiO).

A first interlayer dielectric layer 114 may be provided on the substrate 100. The first interlayer dielectric layer 114 may cover the gate spacers GS and the source/drain patterns SD. The first interlayer dielectric layer 114 may have a top surface substantially coplanar with those of the gate capping patterns GP and those of the gate spacers GS. The first interlayer dielectric layer 114 may be provided thereon with a second interlayer dielectric layer 116 that covers the gate capping patterns GP. A third interlayer dielectric layer 118 may be provided on the second interlayer dielectric layer 116. The first, second, and third interlayer dielectric layers 114, 116, and 118 may include a silicon oxide layer. The first, second, and third interlayer dielectric layers 114, 116, and 118 may constitute one interlayer dielectric layer 110.

Active contacts AC may be provided to penetrate the first and second interlayer dielectric layers 114 and 116 and may have electrical connection with corresponding source/drain patterns SD. Each of the active contacts AC may be provided between a pair of gate electrodes GE. The active contact AC may be a self-aligned contact. For example, the gate capping pattern GP and the gate spacer GS may be used to form the active contact AC in a self-alignment manner. The active contact AC may cover, e.g., at least a portion of a sidewall of the gate spacer GS. The active contact AC may cover a portion of the top surface of the gate capping pattern GP.

The active contact AC may include a conductive pattern FM and a barrier pattern BM that surrounds the conductive pattern FM. The barrier pattern BM may cover sidewalls and a bottom surface of the conductive pattern FM. The conductive pattern FM may include at least one metal, e.g., at least one of aluminum (Al), copper (Cu), tungsten (W), molybdenum (Mo), and cobalt (Co). The barrier pattern BM may include, e.g., a metal nitride layer or a combination of metal and metal nitride layers. The metal layer may include at least one of, e.g., titanium (Ti), tantalum (Ta), tungsten (W), nickel (Ni), cobalt (Co), and platinum (Pt). The metal nitride layer may include at least one of, e.g., a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A silicide pattern SC may be interposed between the active contact AC and the source/drain pattern SD. The active contact AC may be electrically connected through the silicide pattern SC to the source/drain pattern SD. The silicide pattern SC may include, e.g., metal-silicide. For example, the silicide pattern SC may include at least one of, e.g., titanium silicide, tantalum silicide, tungsten silicide, nickel silicide, and cobalt silicide.

Connection patterns CNP may be provided in the third interlayer dielectric layer 118. The connection patterns CNP may be provided on the active contacts AC. The connection patterns CNP may be connected to the active contacts AC. Each of the connection patterns CNP may include a conductive pattern and a barrier pattern. The conductive pattern may include metal the same as or different from that of the conductive pattern FM included in the active contact AC.

One or more wiring layers RL1, RL2, and RL3 may be provided on the interlayer dielectric layer 110. The wiring layers RL1, RL2, and RL3 may be sequentially stacked on a top surface of the interlayer dielectric layer 110.

The first wiring layer RL1 may include the first capping layer 142, the first intermetal dielectric layer 152, and the first wiring pattern 162.

The first capping layer 142 may be provided on the interlayer dielectric layer 110. The first capping layer 142 may cover the top surface of the interlayer dielectric layer 110, top surfaces of the connection patterns CNP, a top surface of an internal wiring pattern 112, and the top surface 130a of the through electrode 130 which will be discussed below.

The first intermetal dielectric layer 152 may be provided on the first capping layer 142. The first intermetal dielectric layer 152 may cover a top surface of the first capping layer 142.

The first wiring pattern 162 may be provided in the first intermetal dielectric layer 152. The first wiring pattern 162 may penetrate the first intermetal dielectric layer 152 and the first capping layer 142, and may contact the connection pattern CNP.

The second wiring layer RL2 may have a configuration similar to that of the first wiring layer RL1. The second wiring layer RL2 may include the second capping layer 144, the second intermetal dielectric layer 154, and the second wiring pattern 164.

The second capping layer 144 may be provided on the first intermetal dielectric layer 152 of the first wiring layer RL1. The second capping layer 144 may cover a top surface of the first intermetal dielectric layer 152 and a top surface of the first wiring pattern 162.

The second intermetal dielectric layer 154 may be provided on the second capping layer 144. The second intermetal dielectric layer 154 may cover a top surface of the second capping layer 144.

The second wiring pattern 164 may be provided in the second intermetal dielectric layer 154. The second wiring pattern 164 may penetrate the second intermetal dielectric layer 154 and the second capping layer 144, and may contact the first wiring pattern 162.

The third wiring layer RL3 may have a configuration similar to that of the first wiring layer RL1 or that of the second wiring layer RL2. The third wiring layer RL3 may include the third capping layer 146, the third intermetal dielectric layer 156, and the third wiring pattern 166.

The third capping layer 146 may be provided on the second intermetal dielectric layer 154 of the second wiring layer RL2. The third capping layer 146 may cover a top surface of the second intermetal dielectric layer 154 and a top surface of the second wiring pattern 164.

The third intermetal dielectric layer 156 may be provided on the third capping layer 146. The third intermetal dielectric layer 156 may cover a top surface of the third capping layer 146.

The third wiring pattern 166 may be provided in the third intermetal dielectric layer 156. The third wiring pattern 166 may penetrate the third intermetal dielectric layer 156 and the third capping layer 146, and may contact the second wiring pattern 164.

The fourth capping layer 148 may be provided on the second wiring layer RL2. The fourth capping layer 148 may cover a top surface of the third intermetal dielectric layer 156 and a top surface of the third wiring pattern 166.

The first upper passivation layer 172 may be provided on the fourth capping layer 148. The first upper passivation layer 172 may cover a top surface of the fourth capping layer 148.

The through electrode 130 may be provided in the substrate 100, the interlayer dielectric layer 110, the first, second, and third wiring layers RL1, RL2, and RL3, and the first upper passivation layer 172. The through electrode 130 may be positioned on the second region RG2 of the substrate 100. The through electrode 130 may vertically penetrate the substrate 100, the interlayer dielectric layer 110, the first, second, and third wiring layers RL1, RL2, and RL3, and the first upper passivation layer 172. The through electrode 130 may have a pillar shape that vertically extends. The through electrode 130 may have a bottom surface exposed on, e.g., through, the bottom surface 100b of the substrate 100. The through electrode 130 may have the top surface 130a exposed on, e.g., through, the top surface 172a of the first upper passivation layer 172.

The through electrode 130 may have the barrier layer 134 on an outer wall of the through electrode 130. The barrier layer 134 may surround the conductive part 132 of the through electrode 130. For example, the barrier layer 134 may surround the outer wall of the through electrode 130.

The through-electrode dielectric layer 120 may be interposed between the through electrode 130 and the interlayer dielectric layer 110, and between the through electrode 130 and the substrate 100. The through-electrode dielectric layer 120 may surround an outer wall of the barrier layer 134 in the substrate 100, the interlayer dielectric layer 110, the first, second, and third wiring layers RL1, RL2, and RL3, and the first upper passivation layer 172.

The second upper passivation layer 174 may be provided on the first upper passivation layer 172. The second upper passivation layer 174 may cover the top surface 172a of the first upper passivation layer 172.

The first upper pad 182 and the second upper pad 184 may be provided in the second upper passivation layer 174. On the first upper passivation layer 172, the first upper pad 182 and the second upper pad 184 may be buried in the second upper passivation layer 174.

On the first region RG1, the first upper pad 182 may be located in the second upper passivation layer 174. The first upper pad 182 may be exposed on a top surface of the second upper passivation layer 174, and may penetrate the first upper passivation layer 172 and the fourth capping layer 148 to electrically contact the third wiring pattern 166. The first upper pad 182 may include the first head part HP1 positioned on the first upper passivation layer 172, and may also include the via part VP that penetrates the first upper passivation layer 172 and contacts the first head part HP1.

On the second region RG2, the second upper pad 184 may be located in the second upper passivation layer 174. The second upper pad 184 may be exposed on the top surface of the second upper passivation layer 174 and may be electrically connected to the through electrode 130. The second upper pad 184 may include the second head part HP2 that lies on the first upper passivation layer 172 and the protruding part PP that extends into the first upper passivation layer 172. The protruding part PP may be in contact with a lateral surface at an upper portion of the through electrode 130.

The upper terminals 192 may be provided on the first upper pad 182 and the second upper pad 184. The upper terminals 192 may be connection terminals for connecting a semiconductor device to an external apparatus. For example, the upper terminals 192 may be solder balls.

The lower passivation layer 176 may be provided below the substrate 100. The lower passivation layer 176 may cover the bottom surface 100b of the substrate 100 and may expose a bottom surface of the through electrode 130.

The lower pad 186 may be provided below the lower passivation layer 176. The lower passivation layer 176 may be provided on its bottom surface with the lower pad 186 electrically connected to the through electrode 130.

Figure 8:
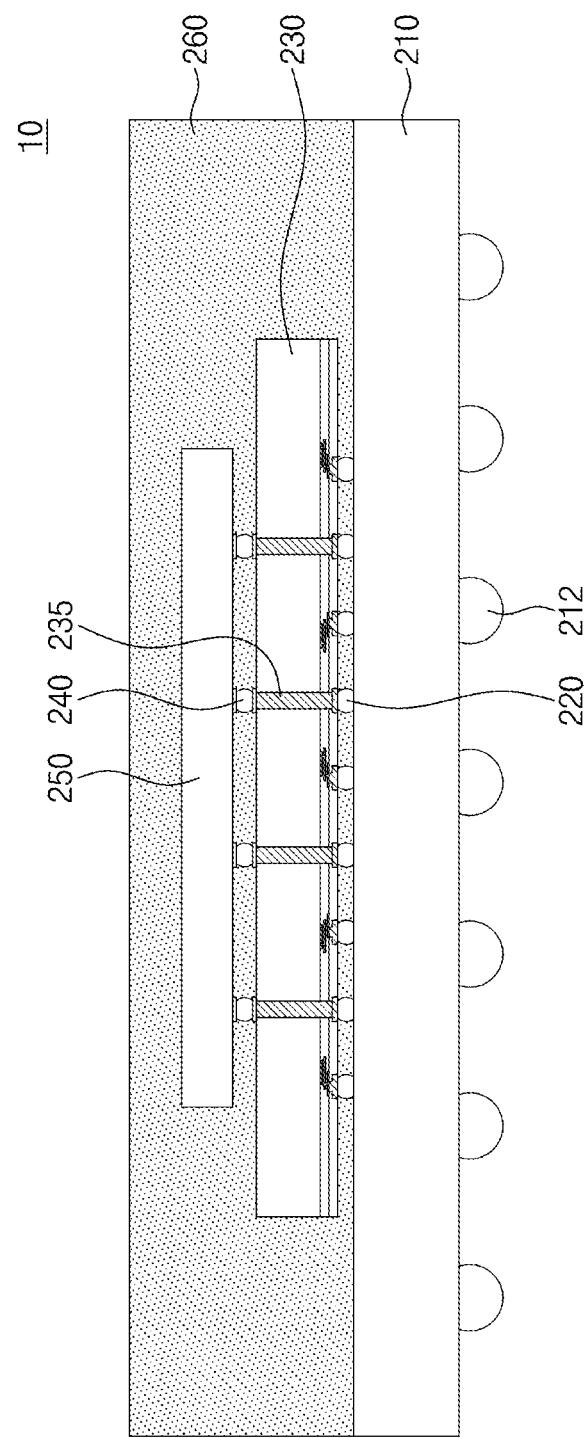
FIG. 8 is a cross-sectional view of a semiconductor package including a semiconductor device according to some embodiments.

FIG. 8 is a cross-sectional view of a semiconductor package including a semiconductor device according to some embodiments.

Referring to FIG. 8, a semiconductor package 10 may include a package substrate 210, e.g., a printed circuit board, having an external terminal 212 attached thereto, an application processor 230 mounted on the package substrate 210, a memory chip 250 stacked on the application processor 230, and a mold layer 260 that covers the application processor 230 and the memory chip 250. The semiconductor package 10 may be used for mobile products, e.g., mobile phones or tablet computers.

The application processor 230 may be electrically connected to the package substrate 210 through a first solder ball 220 disposed on the package substrate 210. The memory chip 250 may be electrically connected to the application processor 230 through a second solder ball 240 disposed on the application processor 230. The application processor 230 may be mounted on the package substrate 210 such that an active surface of the application processor 230 may face the package substrate 210 or the memory chip 250. The memory chip 250 may be stacked on the application processor 230 such that an active surface of the memory chip 250 may face the application processor 230. The application processor 230 may include a through electrode 235, e.g., the through electrode 235 may extend from the first solder ball 220 to the second solder ball 240 and be electrically connected thereto. For example, the application processor 230 with the through electrode 235 may have same or similar structures to those of the semiconductor device and through electrode 130, respectively, of FIGS. 1 to 7. The description of the semiconductor device of FIGS. 1 to 7 may be identically or similarly applicable to the application processor 230.

Figure 9:
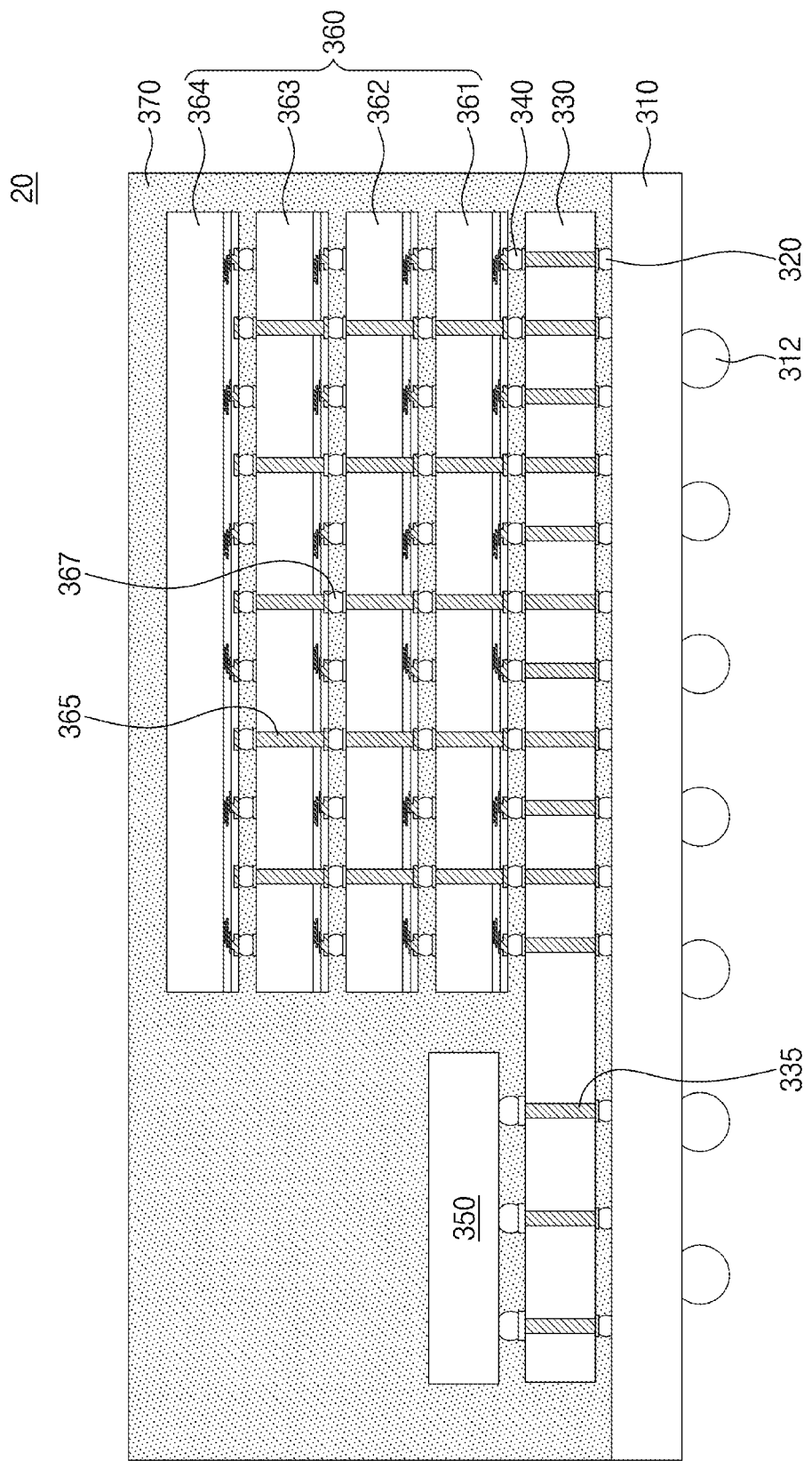
FIG. 9 is a cross-sectional view of a semiconductor module including a semiconductor device according to some embodiments.

FIG. 9 is a cross-sectional view of a semiconductor module including a semiconductor device according to some embodiments.

Referring to FIG. 9, a semiconductor module 20 may be, e.g., a memory module that includes a package substrate 310, e.g., a printed circuit board, having an external terminal 312 attached thereto, a chip stack 360 and a graphic processing unit (GPU) 350 that are mounted on the package substrate 310, and a mold layer 370 that covers the chip stack 360 and the graphic processing unit 350. The semiconductor module 20 may further include an interposer 330 provided on the package substrate 310.

The graphic processing unit 350 and the chip stack 360 may be electrically connected to the interposer 330 through a second solder ball 340 disposed on the interposer 330. The interposer 330 may include a first through electrode 335, and may be electrically connected to the package substrate 310 through a first solder ball 320 disposed on the package substrate 310.

The chip stack 360 may include a plurality of stacked high-bandwidth memory chips 361, 362, 363, and 364. The memory chips 361, 362, 363, and 364 may be electrically connected to each other through solder balls 367. At least one of the memory chips 361, 362, 363, and 364 may include a second through electrode 365. For example, each of first, second, and third memory chips 361, 362, and 363 may include at least one second through electrode 365. A fourth memory chip 364 may include no through electrode. Alternatively, the fourth memory chip 364 may include the second through electrode 365. At least the first, second, and third memory chips 361, 362, and 363 of the memory chips 361, 362, 363, and 364 may have a structure the same as or similar to that of the semiconductor device of FIGS. 1 to 7. The description of the semiconductor device of FIGS. 1 to 7 may be identically or similarly applicable to the first, second, and third memory chips 361, 362, and 363.

FIGS. 10 to 20 are cross-sectional views of stages in a method of fabricating a semiconductor device according to some embodiments.

Figure 10:
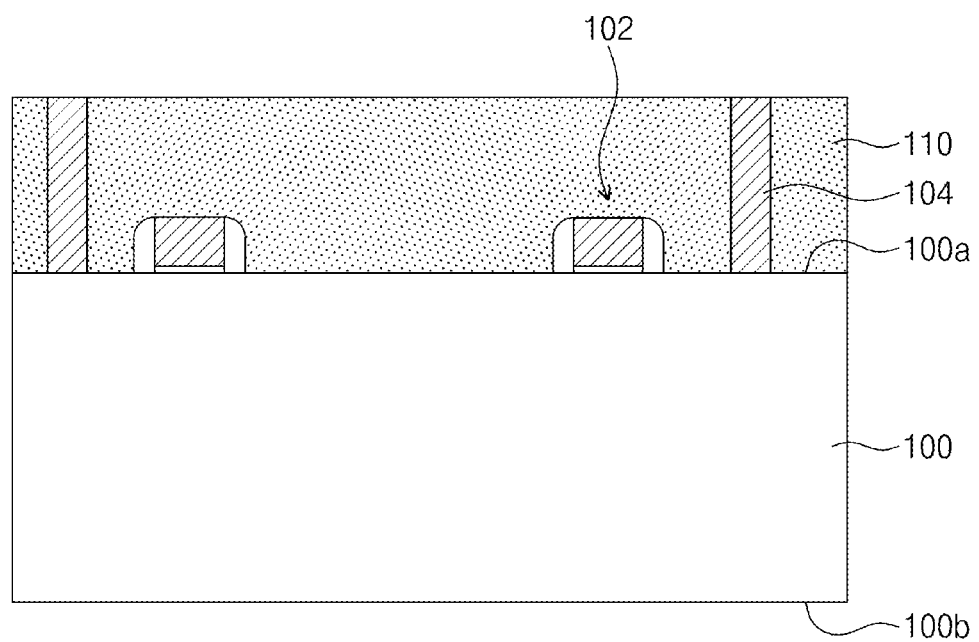
FIGS. 10 to 20 are cross-sectional views of stages in a method of fabricating a semiconductor device according to some embodiments.

Referring to FIG. 10, the substrate 100 may be provided. The substrate 100 may include the top surface 100a and the bottom surface 100b opposite to the top surface 100a. The substrate 100 may include a semiconductor substrate, e.g., a silicon (Si) substrate.

The interlayer dielectric layer 110, which includes the integrated circuit 102, may be formed on the top surface 100a of the substrate 100. The integrated circuit 102 may include, e.g., a memory circuit, a logic circuit, or a combination thereof. The interlayer dielectric layer 110 may be formed of, e.g., a silicon oxide (SiO) layer or a silicon nitride (SiN) layer. For example, the interlayer dielectric layer 110 may include a tetraethylorthosilicate (TEOS) oxide layer formed by chemical vapor deposition (CVD). The interlayer dielectric layer 110 may be patterned and then a conductor may be deposited to form one or more electric contacts 104 that vertically penetrate the interlayer dielectric layer 110. The contacts 104 may be in contact with the substrate 100 or may be electrically connected to the substrate 100 or the integrated circuit 102.

Figure 11:
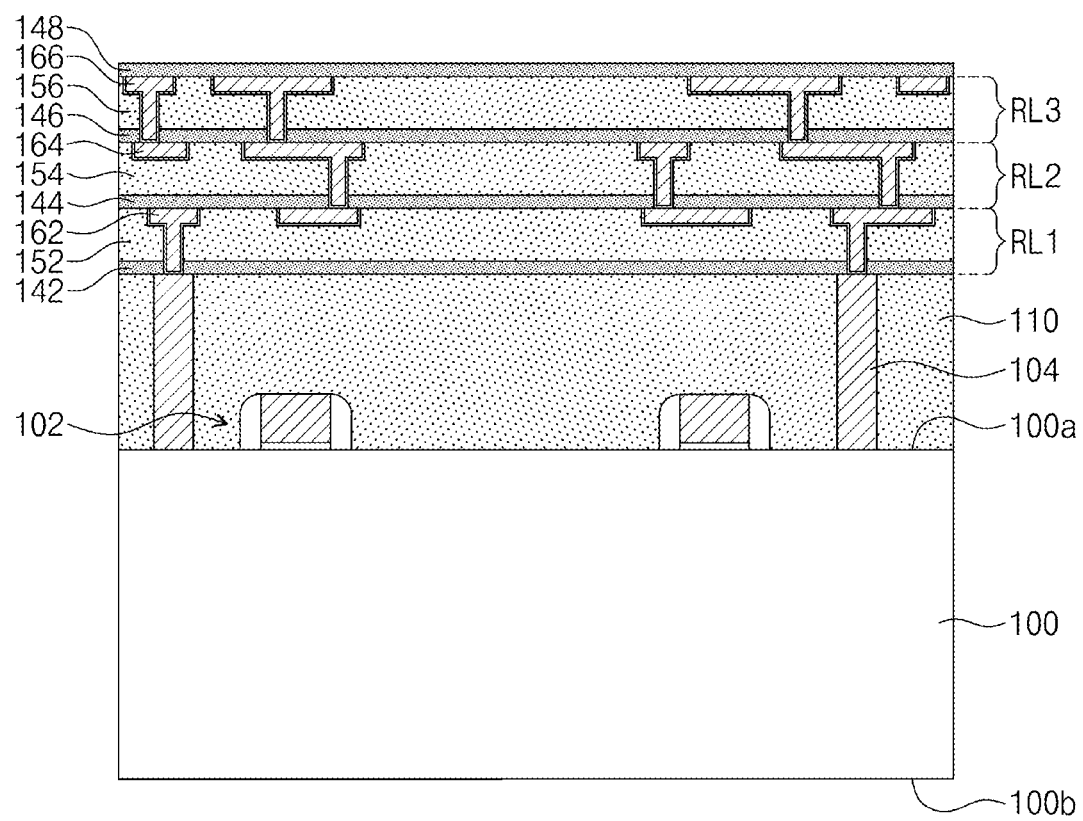

Referring to FIG. 11, the first capping layer 142 may be formed to cover the interlayer dielectric layer 110. The first capping layer 142 may cover the interlayer dielectric layer 110 and the contacts 104. For example, the first capping layer 142 may include a silicon nitride (SiN) layer formed by chemical vapor deposition (CVD). Alternatively, the first capping layer 142 may include a dielectric (e.g., silicon carbonitride (SiCN)) whose dielectric constant is low to prevent diffusion of metallic components included in the contact 104.

The first intermetal dielectric layer 152 may be formed on the first capping layer 142. Identically or similarly to the interlayer dielectric layer 110, the first intermetal dielectric layer 152 may include a tetraethylorthosilicate (TEOS) oxide layer formed by chemical vapor deposition (CVD).

The first wiring pattern 162 may be formed in the first intermetal dielectric layer 152 to have connection with the contact 104. The first wiring pattern 162 may include metal, e.g., copper (Cu), tungsten (W), aluminum (Al), or any combination thereof. The first wiring pattern 162 may include copper formed by, e.g., a damascene process. For example, the first wiring pattern 162 may include the first conductive pattern CP that constitutes a horizontal redistribution line in the first intermetal dielectric layer 152, and may also include the first wiring via VI that vertically penetrates the first intermetal dielectric layer 152 and the first capping layer 142 to contact the bottom surface of the first conductive pattern CP. The first wiring pattern 162 may be formed by, e.g., a dual damascene process.

As such, the first wiring layer RL1 may be formed to include the first capping layer 142, the first intermetal dielectric layer 152, and the first wiring pattern 162. The second wiring layer RL2 and the third wiring layer RL3 may be sequentially formed on the first wiring layer RL1. The formation of the second wiring layer RL2 and the third wiring layer RL3 may be substantially the same as or similar to that of the first wiring layer RL1.

For example, the second wiring layer RL2 may be formed by sequentially forming the second capping layer 144, the second intermetal dielectric layer 154, and the second wiring pattern 164 on the first intermetal dielectric layer 152, and the third wiring layer RL3 may be formed by sequentially forming the third capping layer 146, the third intermetal dielectric layer 156, and the third wiring pattern 166 on the second intermetal dielectric layer 154. The second capping layer 144 and the third capping layer 146 may be formed by a method the same as or similar to that used for forming the first capping layer 142. For example, the second and third capping layers 144 and 146 may include a silicon nitride (SiN) layer formed by chemical vapor deposition (CVD). The second intermetal dielectric layer 154 and the third intermetal dielectric layer 156 may be formed by a method the same as or similar to that used for forming the first intermetal dielectric layer 152. For example, the second and third intermetal dielectric layers 154 and 156 may include a tetraethylorthosilicate (TEOS) oxide layer formed by chemical vapor deposition (CVD). The second wiring pattern 164 and the third wiring pattern 166 may be formed by a method the same as or similar to that used for forming the first wiring pattern 162. For example, the second and third wiring patterns 164 and 166 may include copper formed by a damascene process. As such, the second wiring layer RL2 may be formed to include the second capping layer 144, the second intermetal dielectric layer 154, and the second wiring pattern 164, and the third wiring layer RL3 may be formed to include the third capping layer 146, the third intermetal dielectric layer 156, and the third wiring pattern 166.

The fourth capping layer 148 may be formed on the third wiring layer RL3. The fourth capping layer 148 may be formed by a method the same as or similar to that used for forming the first capping layer 142. For example, the fourth capping layer 148 may include a silicon nitride (SiN) layer formed by chemical vapor deposition (CVD).

Figure 12:
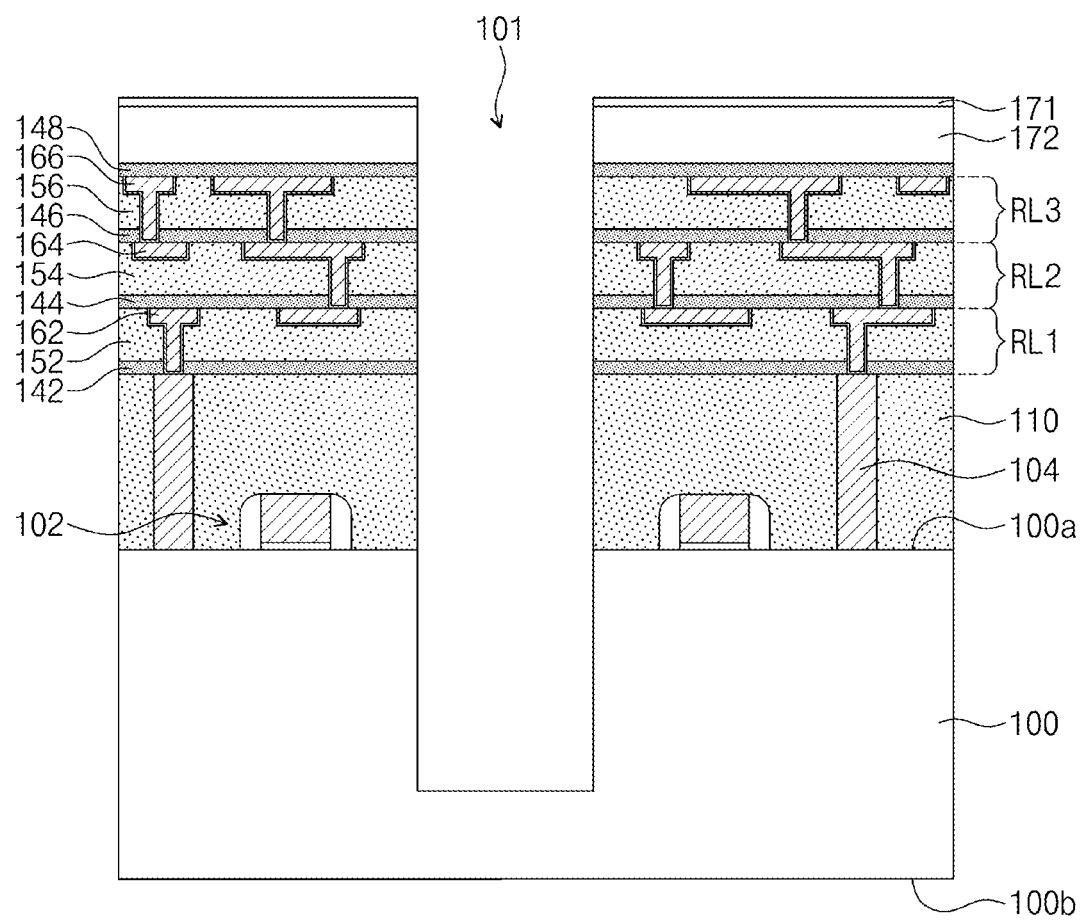

Referring to FIG. 12, the first upper passivation layer 172 may be formed on the fourth capping layer 148. For example, the first upper passivation layer 172 may be formed by depositing on the fourth capping layer 148 a dielectric, e.g., a silicon oxide (SiO) layer, a silicon nitride (SiN) layer, or a polymer.

A polishing stop layer 171 may be formed on the first upper passivation layer 172. The polishing stop layer 171 may be formed of a material different from that of the first upper passivation layer 172. For example, the polishing stop layer 171 may include a silicon nitride (SiN) layer formed by chemical vapor deposition (CVD).

Photo and etching processes may be performed to form a via hole 101 that vertically penetrates the polishing stop layer 171, the first upper passivation layer 172, the first, second, and third wiring layers RL1, RL2, and RL3, the interlayer dielectric layer 110, and the substrate 100. The via hole 101 may completely penetrate the polishing stop layer 171, the first upper passivation layer 172, the first, second, and third wiring layers RL1, RL2, and RL3, and the interlayer dielectric layer 110. The via hole 101 may penetrate, e.g., only, a portion of the substrate 100 and may not reach the bottom surface 100b of the substrate 100.

Figure 13:
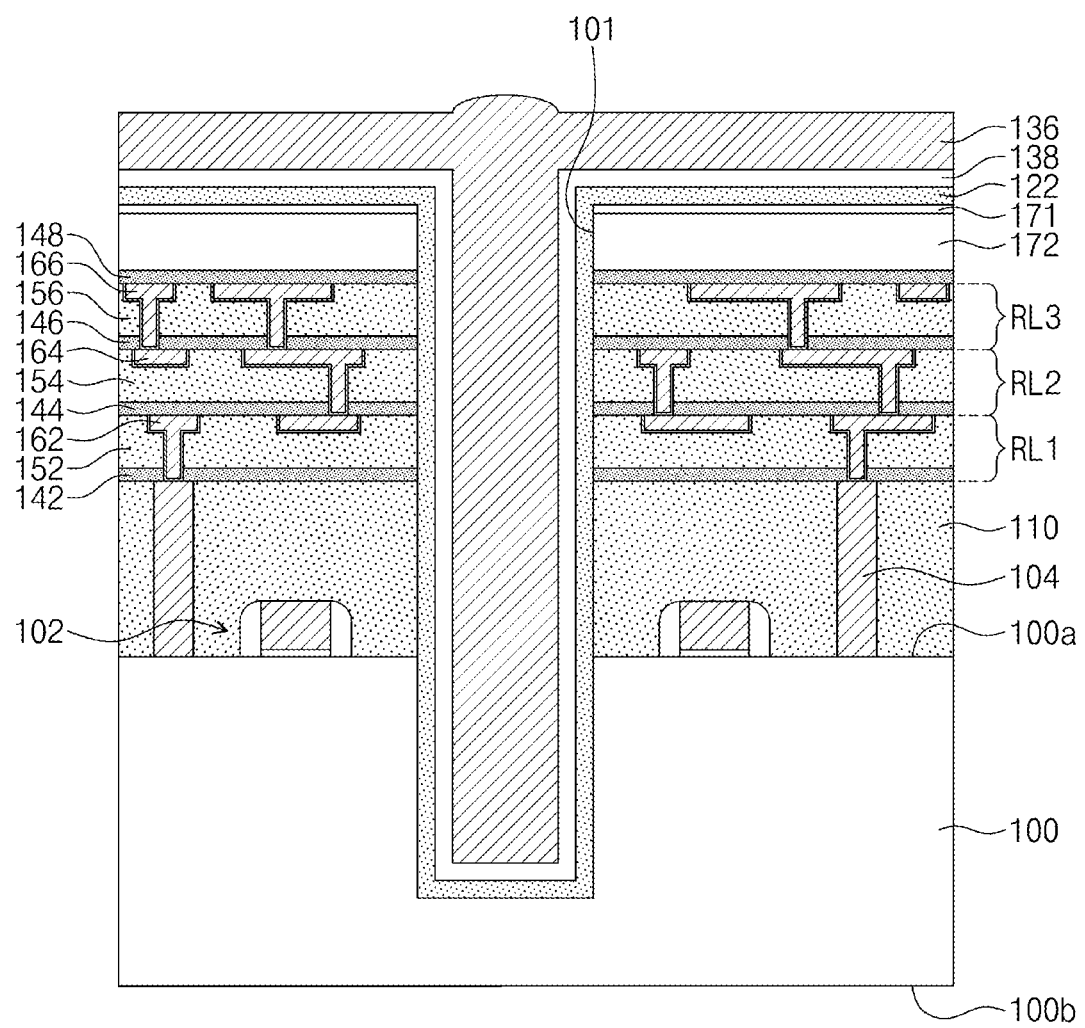

Referring to FIG. 13, a dielectric layer 122 may be, e.g., conformally, formed to cover an inner wall of the via hole 101 and a top surface of the polishing stop layer 171. The dielectric layer 122 may be formed of a high-aspect-ratio process (HARP) layer that is deposited by sub-atmospheric chemical vapor deposition (SACVD).

A conductive layer 136 may be formed on the substrate 100, thereby filling the via hole 101. The conductive layer 136 may be formed by depositing or plating polycrystalline silicon (Si), copper (Cu), tungsten (W), aluminum (Al), etc.

When the conductive layer 136 is formed of copper (Cu) or a copper-containing conductor, the dielectric layer 122 may further be provided thereon with a metal layer 138 capable of preventing diffusion of copper (Cu) elements. The metal layer 138 may be formed by depositing a metallic or conductive material, e.g., titanium (Ti), titanium nitride (TiN), chromium (Cr), tantalum (Ta), tantalum nitride (TaN), nickel (Ni), tungsten (W), tungsten nitride (WN), or any combination thereof, and may have a shape that extends along the dielectric layer 122.

Figure 14:
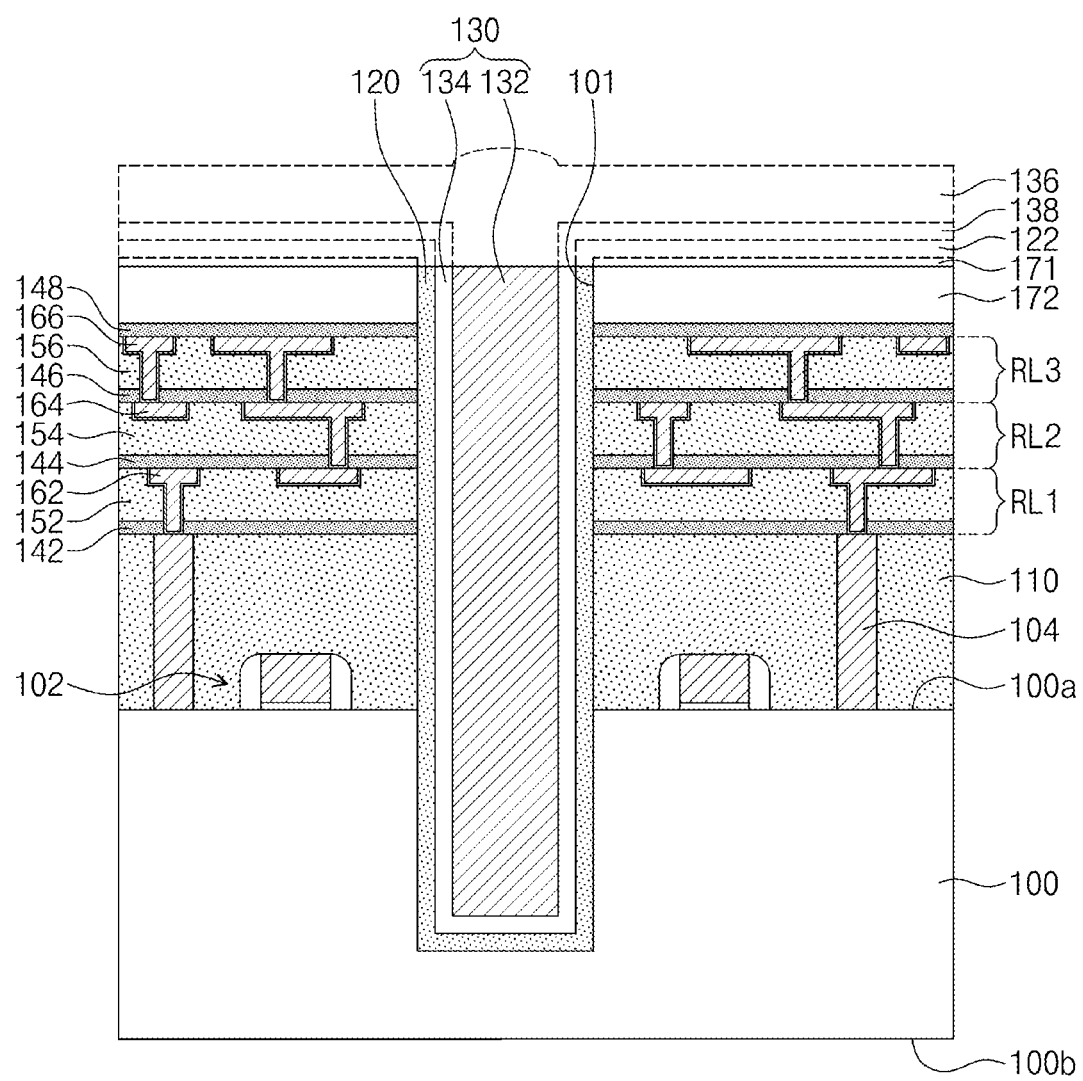

Referring to FIG. 14, a chemical mechanical polishing (CMP) process may be used to planarize the conductive layer 136. The chemical mechanical process may continue until the polishing stop layer 171 is removed. In the planarization process, the dielectric layer 122 and the metal layer 138 may be polished together with the conductive layer 136. The planarization process may convert the conductive layer 136 into a pillar-shaped conductive part 132 of the through electrode 130 that fills the via hole 101, and may also convert the dielectric layer 122 into a cup-shaped through-electrode dielectric layer 120 that surrounds an outer wall and a bottom surface of the through electrode 130. When the metal layer 138 is further formed, the planarization process may convert the metal layer 138 into the barrier layer 134 that prevents a constituent (e.g., copper (Cu)) of the conductive part 132 from diffusing from the through electrode 130 toward the substrate 100 or the integrated circuit 102. The planarization process may expose a top surface of the first upper passivation layer 172. The top surface of the first upper passivation layer 172 may be coplanar with a top surface of the through electrode 130.

Alternatively, the planarization process may continue until the polishing stop layer 171 is exposed. In this case, after the planarization process, the polishing stop layer 171 may be selectively removed. For example, an etching process may be performed in which an etchant capable of selectively removing the polishing stop layer 171 is used to remove the polishing stop layer 171 from the substrate 100. The removal of the polishing stop layer 171 may expose the through electrode 130 and the top surface of the first upper passivation layer 172. In some embodiments, the through electrode 130 may protrude from the top surface of the first upper passivation layer 172.

In some embodiments, the polishing stop layer 171 may not be provided. In this case, the top surface of the through electrode 130 may be coplanar with the top surface of the first upper passivation layer 172.

Figure 15:
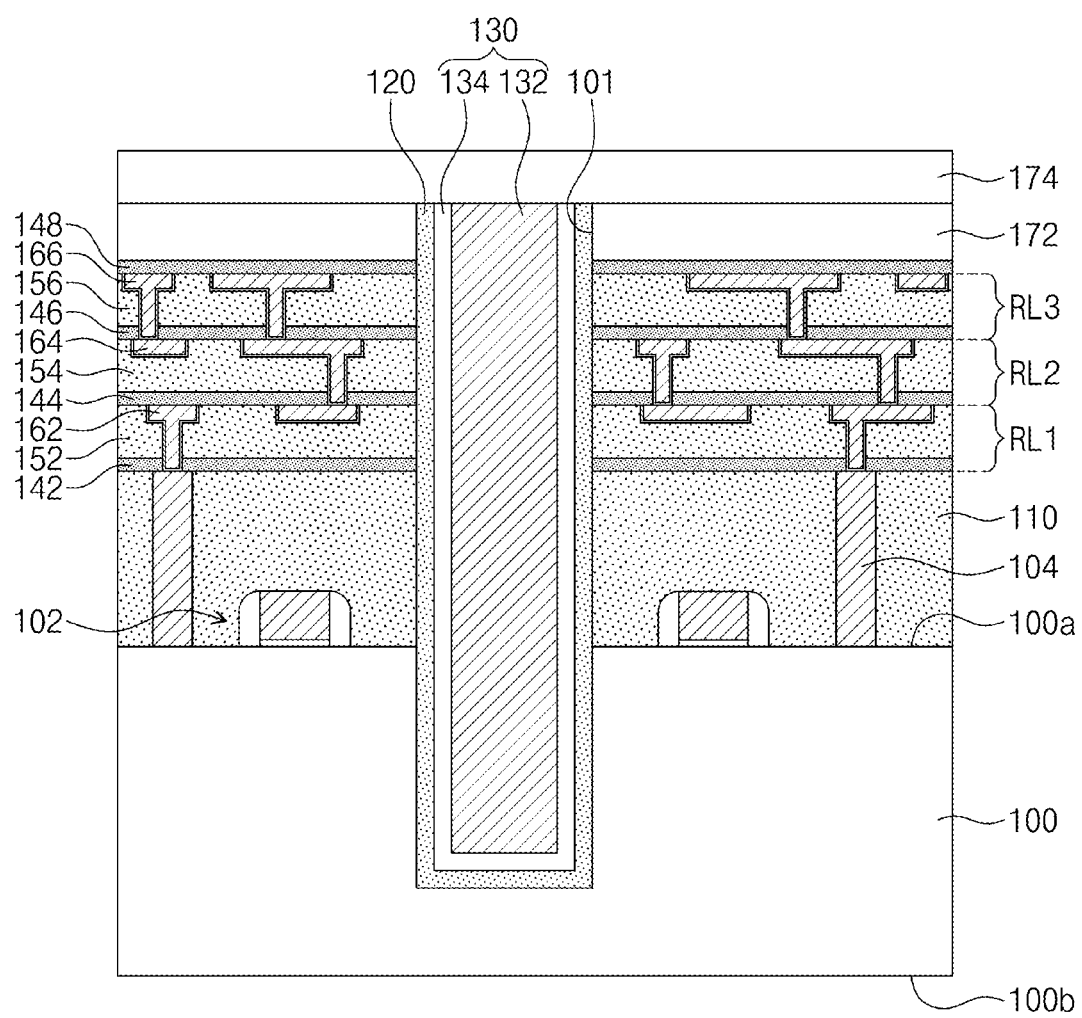

Referring to FIG. 15, the second upper passivation layer 174 may be formed on the first upper passivation layer 172. The second upper passivation layer 174 may be formed by a process the same as or similar to that used for forming the first upper passivation layer 172. For example, the second upper passivation layer 174 may be formed by depositing on the first upper passivation layer 172 a dielectric, e.g., a silicon oxide (SiO) layer, a silicon nitride (SiN) layer, or a polymer. The second upper passivation layer 174 may be formed of the same material as that of the first upper passivation layer 172. The second upper passivation layer 174 may cover the first upper passivation layer 172 and the through electrode 130.

Figure 16:
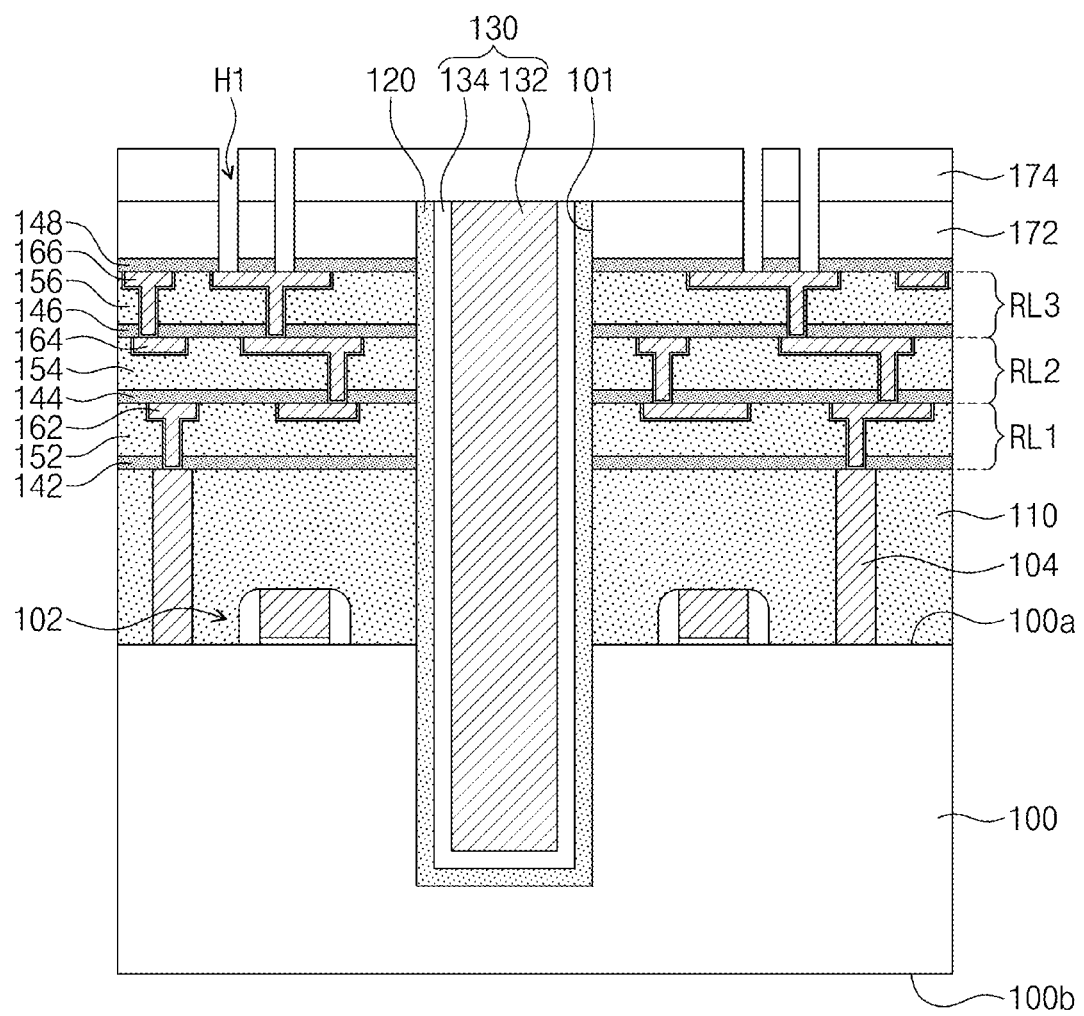

Referring to FIG. 16, the second upper passivation layer 174 may undergo an etching process to form first holes H1. The first holes H1 may penetrate the second upper passivation layer 174, the first upper passivation layer 172, and the fourth capping layer 148, thereby exposing a top surface of the third wiring pattern 166 of the third wiring layer RL3. When viewed in a plan view, the first holes H1 may be located on one side of the through electrode 130.

Figure 17:
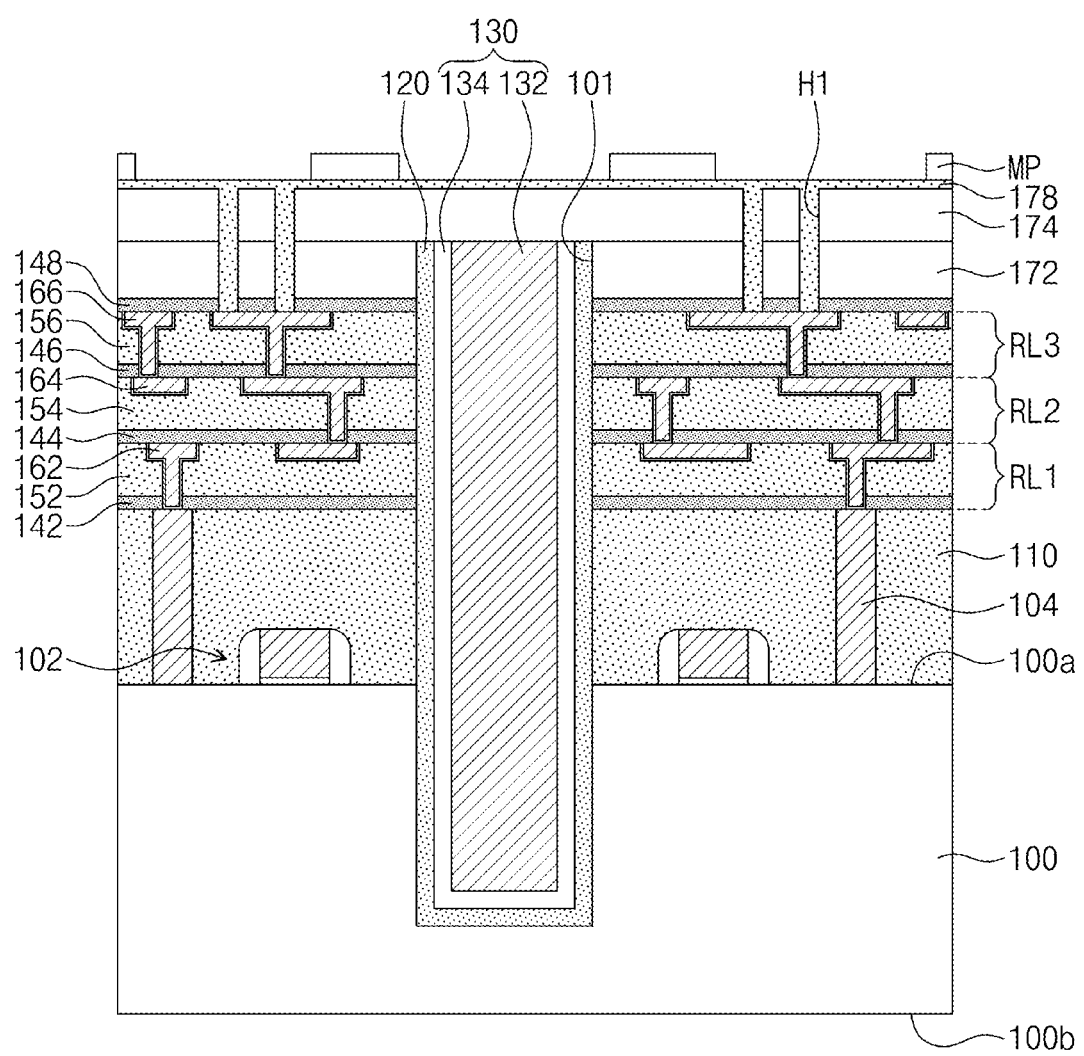

Referring to FIG. 17, a sacrificial layer 178 may be formed on the second upper passivation layer 174. The sacrificial layer 178 may cover a top surface of the second upper passivation layer 174 and may fill the first holes H1.

A mask pattern MP may be formed on the sacrificial layer 178. The mask pattern MP may expose a top surface of the sacrificial layer 178 on the first holes H1 and may also expose a top surface of the sacrificial layer 178 on the through electrode 130.

Figure 18:
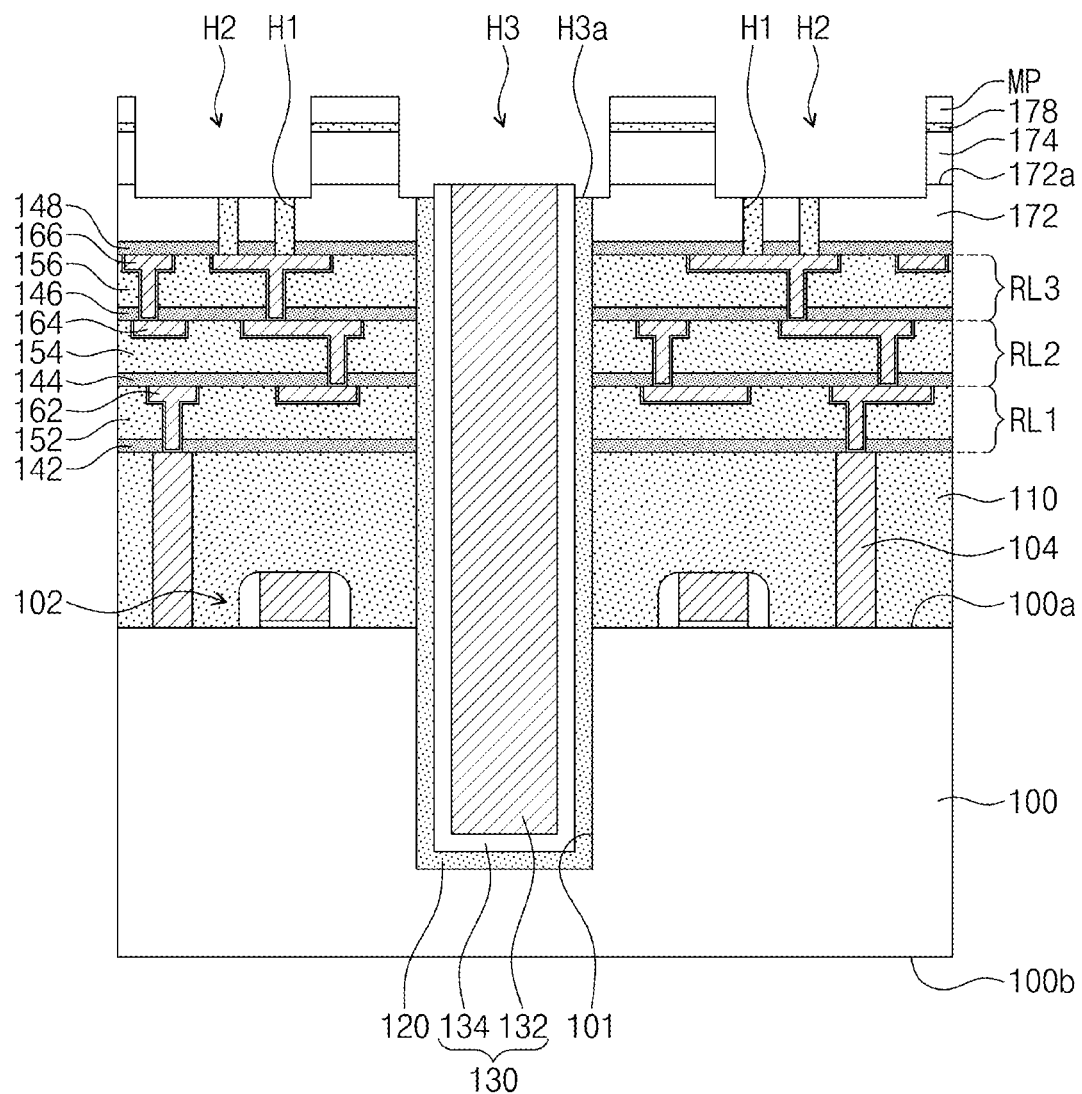

Referring to FIG. 18, the sacrificial layer 178 may undergo an etching process in which the mask pattern MP is used as an etching mask to form a second hole H2 and a third hole H3. The second hole H2 may be formed on the first holes H1, and the third hole H3 may be formed on the through electrode 130. The second and third holes H2 and H3 may be formed to completely penetrate the sacrificial layer 178 and the second upper passivation layer 174. The etching process may also remove a portion of the first upper passivation layer 172. For example, the second and third holes H2 and H3 may be formed to extend into the first upper passivation layer 172. A bottom surface of the second hole H2 and a bottom surface H3a of the third hole H3 may be at a level lower than a level of the top surface 172a of the first upper passivation layer 172. The first holes H1 may be exposed on the bottom surface of the second hole H2. The through electrode 130 may protrude upward from, e.g., above, the bottom surface H3a of the third hole H3. In the etching process, the through-electrode dielectric layer 120 may also be etched. Therefore, the through-electrode dielectric layer 120 may have a top surface coplanar with the bottom surface H3a of the third hole H3. An outer lateral surface at an upper portion of the through electrode 130 may be exposed in the third hole H3.

Figure 19:
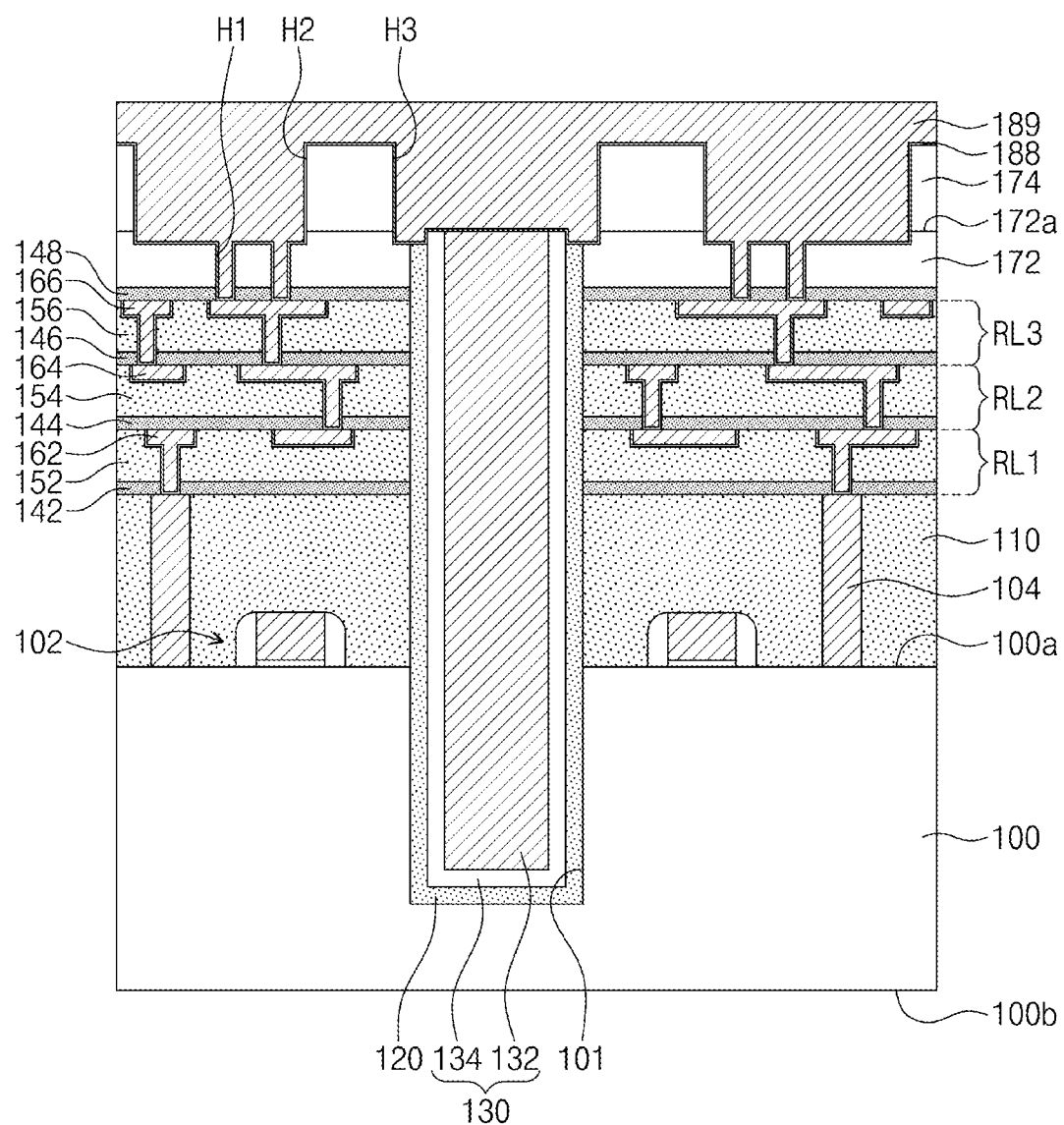

Referring to FIG. 19, the mask pattern MP and the sacrificial layer 178 may be removed to expose the top surface of the second upper passivation layer 174. The sacrificial layer 178 may be removed from the first holes H1, and thus the first holes H1 may be spatially connected to the second hole H2, e.g., the first and second holes H1 and H2 may be in fluid communication with each other. The first holes H1 may each define an area where the via part VP of the first upper pad 182 is to be formed, which will be discussed below, and the second hole H2 may define an area where the first head part HP1 of the first upper pad 182 is to be formed, which will be discussed below. A space of the third hole H3 located on one side of the through electrode 130 may define an area where the protruding part PP of the second upper pad 184 is to be formed, which will be discussed below, and a space of the third hole H3 located at a higher level than that of the through electrode 130 may define an area where the second head part HP2 of the second upper pad 184 is to be formed, which will be discussed below.

A seed layer 188 may be formed on the second upper passivation layer 174. The seed layer 188 may be formed to conformally cover the top surface of the second upper passivation layer 174, an inside of the second hole H2, and an inside of the third hole H3. In the third hole H3, the seed layer 188 may be in contact with the top surface of the through electrode 130 and the exposed outer lateral surface of the through electrode 130.

A conductive layer 189 may be formed on the seed layer 188. The conductive layer 189 may cover the top surface of the second upper passivation layer 174, and may fill the inside of each of the second and third holes H2 and H3.

Figure 20:
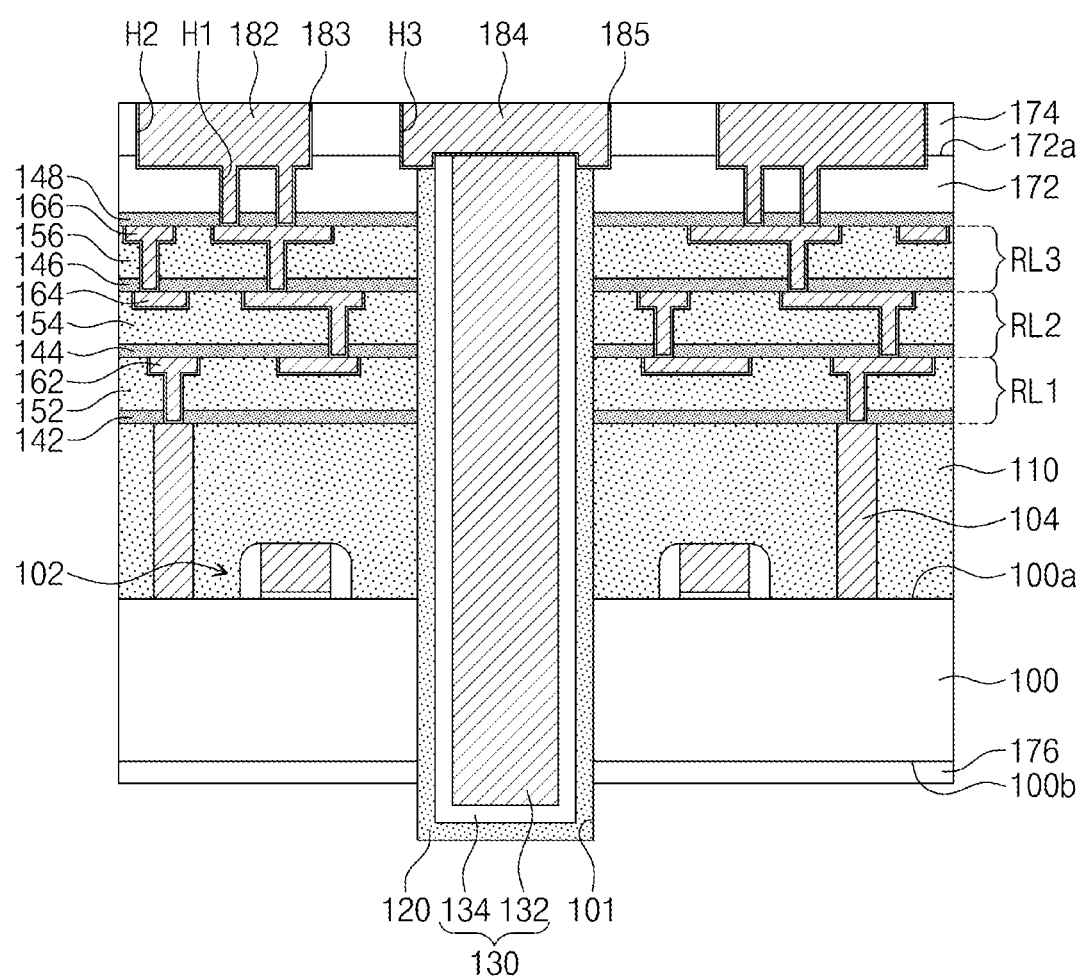

Referring to FIG. 20, a planarization process, e.g., chemical mechanical polishing (CMP), may be used to planarize the conductive layer 189. The planarization process may continue until the top surface of the second upper passivation layer 174 is exposed. In the planarization process, the seed layer 188 may be polished together with the conductive layer 189. The planarization process may convert the conductive layer 189 into the first upper pad 182 that fills the first hole H1 and the second upper pad 184 that fills the third hole H3, and may also convert the seed layer 188 into the first seed layer 183 that surrounds an outer wall and a bottom surface of the first upper pad 182 and the second seed layer 185 that surrounds an outer wall and a bottom surface of the second upper pad 184.

The substrate 100 may be recessed to protrude the through electrode 130. For example, the bottom surface 100b of the substrate 100 may be recessed by an etching process that uses an etchant capable of selectively removing a material (e.g., silicon (Si)) of the substrate 100, a chemical mechanical polishing (CMP) process, a grinding process, or any combination thereof. The recess process may continue until the through electrode 130 is revealed on the bottom surface 100b of the substrate 100. For example, a chemical mechanical polishing (CMP) process may be performed such that the through electrode 130 may not be allowed to expose on the bottom surface 100b of the substrate 100, and thereafter a dry etching process may be performed such that the through electrode 130 may be allowed to expose on the bottom surface 100b of the substrate 100.

The lower passivation layer 176 may be formed to cover the bottom surface 100b of the substrate 100. For example, the lower passivation layer 176 may be formed by depositing a dielectric, e.g., a silicon oxide (SiO) layer, a silicon nitride (SiN) layer, or a polymer.

A planarization process may be performed on the lower passivation layer 176. The planarization process may expose the through electrode 130. The planarization process may etch the through-electrode dielectric layer 120 and the barrier layer 134 of the through electrode 130. Therefore, the barrier layer 134 and the conductive part 132 of the through electrode 130 may be exposed on a bottom surface of the lower passivation layer 176.

Referring back to FIG. 1, on the lower passivation layer 176, the lower pad 186 may be formed to have an electrical connection with the through electrode 130. For example, the lower pad 186 may be formed of copper (Cu). Differently from that shown in FIG. 1, the lower pad 186 may be shaped like a solder ball.

The processes mentioned above may fabricate the semiconductor device discussed with reference to FIGS. 1 to 3.

By way of summation and review, a through electrode that penetrates a substrate has been proposed to electrically connect a semiconductor device to another semiconductor device or a printed circuit board. The through electrode may be used to achieve a three-dimensional mounting and may accomplish a transfer speed greater than that of a conventional solder ball or solder bump. Accordingly, it is needed to form through electrodes having electrical reliability.

Therefore, embodiments provide a semiconductor device with improved electrical reliability and a method of fabricating the same. Embodiments also provide a semiconductor device having enhanced structural stability and a method of fabricating the same.

That is, according to some embodiments, a semiconductor device may include a through electrode that penetrates the entirety of a substrate, an interlayer dielectric layer, and wiring layers to directly contact an upper pad that corresponds to a pad of the semiconductor device. As such, an electrical resistance may be reduced between the upper pad and the through electrode. In addition, the upper pad may be provided to contact not only a top surface of the through electrode, but a lateral surface of the through electrode, and accordingly a contact resistance may be reduced between the upper pad and the through electrode. As a result, the semiconductor device may be provided with improved electrical characteristics. Moreover, because no connection lines are provided between the upper pad and the through electrode, and because the wide through electrode is used alone to achieve an electrical connection to the upper pad, the semiconductor device may be strong against external impact and may increase in structural stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   an integrated circuit on the substrate;
   an interlayer dielectric layer on the substrate;
   a contact that penetrates the interlayer dielectric layer, the contact being electrically connected to the integrated circuit;
   at least one wiring layer on the interlayer dielectric layer, the at least one wiring layer including a wiring line electrically connected to the contact;
   a first passivation layer on the at least one wiring layer;
   a first pad and a second pad on the first passivation layer; and
   a through electrode that penetrates the substrate, the interlayer dielectric layer, the at least one wiring layer, and the first passivation layer, the through electrode being connected to the first pad,
   wherein the first pad includes:
      a first head part on the first passivation layer, and
      a protruding part that extends into the first passivation layer from the first head part, the protruding part surrounding a lateral surface of the through electrode in the first passivation layer, and
   wherein the second pad is connected to the integrated circuit through the wiring line and the contact.

2. The semiconductor device as claimed in claim 1, wherein the second pad includes:
   a second head part on the first passivation layer; and
   a via part that extends from the second head part into the first passivation layer, a bottom surface of the via part being at a level lower than a level of a bottom surface of the protruding part of the first pad.

3. The semiconductor device as claimed in claim 2, wherein a width of the through electrode is about 20 times to about 100 times a width of the via part.

4. The semiconductor device as claimed in claim 2, further comprising a second passivation layer on the first passivation layer, the second passivation layer surrounding the first head part and the second head part, as viewed in a plan view.

5. The semiconductor device as claimed in claim 2, wherein a bottom surface of the second head part of the second pad is at a same level as that of the bottom surface of the protruding part of the first pad.

6. The semiconductor device as claimed in claim 1, wherein a top surface of the through electrode is at a same level as that of a top surface of the first passivation layer.

7. The semiconductor device as claimed in claim 1, wherein, when viewed in a plan view, the protruding part of the first pad has a closed curve shape that surrounds the through electrode, the protruding part of the first pad being in contact with the lateral surface of the through electrode.

8. The semiconductor device as claimed in claim 1, wherein a width of the protruding part of the first pad decreases with an increasing distance from a top surface of the first passivation layer.

9. The semiconductor device as claimed in claim 1, further comprising a barrier layer that covers a bottom surface and a lateral surface of the first pad, the barrier layer being between the first passivation layer and the first pad and between the through electrode and the first pad.

10. The semiconductor device as claimed in claim 1, wherein the at least one wiring layer includes:
- a capping layer;
- an intermetal dielectric layer on the capping layer;
- conductive patterns in the intermetal dielectric layer; and
- a wiring via on the contact and connected to the conductive patterns, the wiring via penetrating the capping layer and the intermetal dielectric layer,
- wherein the conductive patterns and the wiring via constitute the wiring line.

11. The semiconductor device as claimed in claim 1, wherein the at least one wiring layer includes a plurality of wiring layers, the plurality of wiring layers being sequentially stacked on the interlayer dielectric layer, and the through electrode vertically penetrating all of the plurality of wiring layers.

* * * * *